US010067706B2

(12) United States Patent
Verrilli et al.

(10) Patent No.: US 10,067,706 B2
(45) Date of Patent: Sep. 4, 2018

(54) PROVIDING MEMORY BANDWIDTH COMPRESSION USING COMPRESSION INDICATOR (CI) HINT DIRECTORIES IN A CENTRAL PROCESSING UNIT (CPU)-BASED SYSTEM

(71) Applicant: QUALCOMM Incorporated, San Diego, CA (US)

(72) Inventors: Colin Beaton Verrilli, Apex, NC (US); Mattheus Cornelis Antonius Adrianus Heddes, Raleigh, NC (US); Natarajan Vaidhyanathan, Carrboro, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/086,882

(22) Filed: Mar. 31, 2016

(65) Prior Publication Data
US 2017/0286001 A1    Oct. 5, 2017

(51) Int. Cl.
G06F 12/08    (2016.01)
G06F 12/10    (2016.01)
(Continued)

(52) U.S. Cl.
CPC .......... G06F 3/0638 (2013.01); G06F 3/0604 (2013.01); G06F 3/0632 (2013.01);
(Continued)

(58) Field of Classification Search
CPC ............. G06F 11/1004; G06F 11/1076; G06F 12/0223; G06F 12/0862; G06F 12/0875;
(Continued)

(56) References Cited

U.S. PATENT DOCUMENTS 5,696,927 A     12/1997  MacDonald et al.
6,795,897 B2     9/2004  Benveniste et al.
(Continued)

OTHER PUBLICATIONS

Author Unknown, "Understanding Memory Resource Management in VMware ESX 4.1," VMware, Inc., 2010, retrieved from http://www.vmware.com/files/pdf/techpaper/vsp_41_perf_memory_mgmt_pdf, 25 pages.
(Continued)

Primary Examiner — Yong Choe
(74) Attorney, Agent, or Firm — W&T/Qualcomm

(57) ABSTRACT

Providing memory bandwidth compression using compression indicator (CI) hint directories in a central processing unit (CPU)-based system is disclosed. In this regard, a compressed memory controller provides a CI hint directory comprising a plurality of CI hint directory entries, each providing a plurality of CI hints. The compressed memory controller is configured to receive a memory read request comprising a physical address of a memory line, and initiate a memory read transaction comprising a requested read length value. The compressed memory controller is further configured to, in parallel with initiating the memory read transaction, determine whether the physical address corresponds to a CI hint directory entry in the CI hint directory. If so, the compressed memory controller reads a CI hint from the CI hint directory entry of the CI hint directory, and modifies the requested read length value of the memory read transaction based on the CI hint.

29 Claims, 16 Drawing Sheets

(51) Int. Cl.
| | |
|---|---|
| *G06F 3/06* | (2006.01) |
| *G06F 11/10* | (2006.01) |
| *G06F 12/02* | (2006.01) |
| *G06F 12/0875* | (2016.01) |
| *H03M 7/30* | (2006.01) |
| *H03M 13/00* | (2006.01) |
| *G06F 12/0862* | (2016.01) |
| *G06F 12/12* | (2016.01) |

(52) U.S. Cl.
CPC ........ *G06F 3/0673* (2013.01); *G06F 11/1004* (2013.01); *G06F 11/1076* (2013.01); *G06F 12/0223* (2013.01); *G06F 12/0875* (2013.01); *H03M 7/30* (2013.01); *H03M 13/6312* (2013.01); *G06F 12/0862* (2013.01); *G06F 12/12* (2013.01); *G06F 2212/1024* (2013.01); *G06F 2212/1044* (2013.01); *G06F 2212/401* (2013.01); *G06F 2212/403* (2013.01); *G06F 2212/466* (2013.01)

(58) Field of Classification Search
CPC ............. G06F 12/12; G06F 2212/1024; G06F 2212/1044; G06F 2212/401; G06F 2212/403; G06F 2212/466; G06F 3/0604; G06F 3/0632
See application file for complete search history.

(56) References Cited

U.S. PATENT DOCUMENTS

| | | | |
|---|---|---|---|
| 7,162,583 B2 | 1/2007 | Adl-Tabatabai et al. | |
| 7,257,693 B2 | 8/2007 | Newburn et al. | |
| 7,277,988 B2 | 10/2007 | Gower et al. | |
| 7,680,992 B1 | 3/2010 | Van Dyke et al. | |
| 8,176,288 B2 | 5/2012 | Dye | |
| RE43,483 E | 6/2012 | Geiger et al. | |
| 8,341,380 B2 | 12/2012 | Deming et al. | |
| 8,441,495 B1 | 5/2013 | Van Dyke et al. | |
| 8,510,518 B2 | 8/2013 | O'Connor | |
| 8,751,904 B2 | 6/2014 | Wang et al. | |
| 2004/0054847 A1 | 3/2004 | Spencer et al. | |
| 2011/0161774 A1 | 6/2011 | Shin et al. | |
| 2013/0179752 A1 | 7/2013 | Shim et al. | |
| 2014/0095561 A1 | 4/2014 | Wegener | |
| 2015/0339237 A1 | 11/2015 | Heddes et al. | |
| 2015/0339239 A1* | 11/2015 | Heddes | G06F 12/1081 710/308 |

OTHER PUBLICATIONS

Pekhimenko, G. et al., "Linearly Compressed Pages: A Low-Complexity,Low-Latency Main Memory Compression Framework," Proceedings of the 46th Annual IEEE/ACM International Symposium on Microarchitecture (MICRO-46), Dec. 7-11, 2013, Davis, CA, ACM, 13 pages.

International Search Report and Written Opinion for PCT/US2017022049, dated May 30, 2017, 19 pages.

Second Written Opinion for PCT/US2017/022049, dated Mar. 2, 2018, 11 pages.

International Preliminary Report on Patentability for PCT/US2017/022049, dated Jun. 7, 2018, 33 pages.

* cited by examiner

PROVIDING MEMORY BANDWIDTH COMPRESSION USING COMPRESSION INDICATOR (CI) HINT DIRECTORIES IN A CENTRAL PROCESSING UNIT (CPU)-BASED SYSTEM

BACKGROUND

I. Field of the Disclosure

The technology of the disclosure relates generally to computer memory systems, and, in particular, to memory controllers in computer memory systems for providing central processing units (CPUs) with a memory access interface to memory.

II. Background

Microprocessors perform computational tasks for a wide variety of applications. A typical microprocessor application includes one or more central processing units (CPUs) that execute software instructions. The software instructions may instruct a CPU to fetch data from a location in memory, perform one or more CPU operations using the fetched data, and generate a result. The result may then be stored in memory. As non-limiting examples, this memory can be a cache local to the CPU, a shared local cache among CPUs in a CPU block, a shared cache among multiple CPU blocks, or a main memory of the microprocessor.

In this regard, FIG. 1 is a schematic diagram of an exemplary system-on-a-chip (SoC) 100 that includes a CPU-based system 102. The CPU-based system 102 includes a plurality of CPU blocks 104(0)-104(N) in this example, wherein 'N' is equal to any number of CPU blocks 104(0)-104(N) desired. In the example of FIG. 1, each of the CPU blocks 104(0)-104(N) contains two (2) CPUs 106(0), 106(1). The CPU blocks 104(0)-104(N) further contain shared Level 2 (L2) caches 108(0)-108(N), respectively. A system cache 110 (e.g., a Level 3 (L3) cache) is also provided for storing cached data that is used by any of, or shared among, each of the CPU blocks 104(0)-104(N). An internal system bus 112 is provided to enable each of the CPU blocks 104(0)-104(N) to access the system cache 110, as well as other shared resources. Other shared resources accessed by the CPU blocks 104(0)-104(N) through the internal system bus 112 may include a memory controller 114 for accessing a main, external memory (e.g., double-rate dynamic random access memory (DRAM) (DDR), as a non-limiting example), peripherals 116, other storage 118, an express peripheral component interconnect (PCI) (PCI-e) interface 120, a direct memory access (DMA) controller 122, and/or an integrated memory controller (IMC) 124.

As CPU-based applications executing in the CPU-based system 102 in FIG. 1 increase in complexity and performance, limitations on memory bandwidth may impose a constraint on the CPU-based system 102. If accesses to external memory reach memory bandwidth limits, the memory controller 114 of the CPU-based system 102 may be forced to queue memory access requests. Such queueing of memory access requests may increase the latency of memory accesses, which in turn may decrease the performance of the CPU-based system 102.

Memory bandwidth savings may be realized by employing memory bandwidth compression schemes to potentially reduce the bandwidth consumed by a given memory access. In particular, some memory bandwidth compression schemes may make use of a master directory to track a compression status for each memory line of a system memory. However, the master directory used by such memory bandwidth compression schemes may consume an unacceptably large portion of the system memory, may require implementation of additional logic, and/or may incur additional latency for any memory access request. Other memory bandwidth compression schemes may use spare bits in an error correcting code (ECC) field to indicate a compression status for each memory line of the system memory. While such mechanisms may avoid the need for a master directory, they may sacrifice some memory access performance, as the compression state for each line of system memory may not be determined until after an initial read of the line is complete. Thus, it is desirable to provide a memory bandwidth compression mechanism that avoids the drawbacks of using a master directory while providing improved memory access performance.

SUMMARY OF THE DISCLOSURE

Aspects disclosed herein include providing memory bandwidth compression using compression indicator (CI) hint directories in a central processing unit (CPU)-based system. In this regard, in some aspects, a compressed memory controller is provided. The compressed memory controller includes a CI hint directory, which stores multiple CI hint directory entries. Each CI hint directory entry provides multiple CI hints, each corresponding to a memory line in a system memory. According to some aspects, the number of CI hints per CI hint directory entry may be selected to optimize a memory access granularity of the system memory. As a non-limiting example, if the memory access granularity of the system memory is 64 bytes, the CI hint directory may be configured to store 64 bytes of CI hints in each CI hint directory entry. Each CI hint provides an indication regarding a compression state of the corresponding memory line. In some aspects, as a non-limiting example, each CI hint may be made up of two (2) bits that indicate one of four (4) compression states of the memory line: the memory line comprises a specified pattern (e.g., all zeroes (0), as a non-limiting example); the memory line is known to be compressed; the memory line is known to be uncompressed; or the compression state of the memory line is unknown.

Upon receiving a memory read request, the compressed memory controller issues a memory read transaction having a requested read length value. In parallel with issuing the memory read transaction, the compressed memory controller accesses the CI hint directory to determine whether a CI hint directory entry corresponding to a physical address of the memory read request exists in the CI hint directory. If so, the compressed memory controller reads a CI hint for the memory line that is the target of the memory read request. Based on the CI hint, the compressed memory controller may modify the requested read length value of the memory read transaction. For example, the compressed memory controller may modify the requested read length value of the memory read transaction to correspond to a compressed length or an uncompressed length of the memory line, or may cancel the memory read transaction if the memory line comprises all zeroes (0). Upon completion of the memory read transaction, the CI hint for the memory line may be updated based on a CI stored in one or more error correcting code (ECC) bits of the memory line. The CI hint for the memory line may also be updated by the compressed memory controller upon a write to compressed data to the memory line.

In this manner, the compressed memory controller may improve memory access performance by using the CI hint directory to track a compression status for each memory line of a system memory, while avoiding the memory consumption, access latency, and additional logic required to implement a master directory. The compressed memory controller may also improve memory access performance by determining a compression status of a memory line in the system memory prior to completion of a memory read operation, thus enabling the compressed memory controller to modify the memory read operation while in-flight.

In another aspect, a compressed memory controller is provided. The compressed memory controller comprises a memory interface configured to access a system memory via a system bus. The compressed memory controller further comprises a CI hint directory comprising a plurality of CI hint directory entries, each comprising a plurality of CI hints. The compressed memory controller is configured to receive a memory read request comprising a physical address of a memory line in the system memory. The compressed memory controller is further configured to initiate a memory read transaction comprising a requested read length value to the system memory based on the physical address. The compressed memory controller is also configured to, in parallel with initiating the memory read transaction, determine whether the physical address corresponds to a CI hint directory entry of the plurality of CI hint directory entries of the CI hint directory. The compressed memory controller is additionally configured to, responsive to determining that the physical address corresponds to a CI hint directory entry of the plurality of CI hint directory entries of the CI hint directory, read a CI hint of the plurality of CI hints for the memory line from the CI hint directory entry. The compressed memory controller is further configured to modify the requested read length value of the memory read transaction based on the CI hint for the memory line.

In another aspect, a compressed memory controller is provided. The compressed memory controller comprises a memory interface configured to access a system memory via a system bus. The compressed memory controller further comprises a CI hint directory comprising a plurality of CI hint directory entries, each comprising a plurality of CI hints. The compressed memory controller is configured to receive a memory write request comprising write data and a physical address of a memory line in the system memory. The compressed memory controller is further configured to determine a compression pattern for the write data. The compressed memory controller is also configured to generate a CI for the write data based on the compression pattern. The compressed memory controller is additionally configured to write the write data to the memory line in the system memory. The compressed memory controller is further configured to write the generated CI into one or more ECC bits of the memory line in the system memory. The compressed memory controller is also configured to, in parallel with writing the write data to the memory line in the system memory, determine whether the physical address corresponds to a CI hint directory entry of the plurality of CI hint directory entries of the CI hint directory. The compressed memory controller is additionally configured to, responsive to determining that the physical address corresponds to a CI hint directory entry of the plurality of CI hint directory entries of the CI hint directory, update a CI hint of the plurality of CI hints of the CI hint directory entry corresponding to the physical address based on the generated CI.

In another aspect, a method for providing memory bandwidth compression is provided. The method comprises receiving, by a compressed memory controller, a memory read request comprising a physical address of a memory line in a system memory. The method further comprises initiating a memory read transaction comprising a requested read length value to the system memory based on the physical address. The method also comprises, in parallel with initiating the memory read transaction, determining whether the physical address corresponds to a CI hint directory entry of a plurality of CI hint directory entries of a CI hint directory of the compressed memory controller. The method additionally comprises, responsive to determining that the physical address corresponds to a CI hint directory entry of the plurality of CI hint directory entries of the CI hint directory of the compressed memory controller, reading a CI hint of a plurality of CI hints for the memory line from the CI hint directory entry. The method further comprises modifying the requested read length value of the memory read transaction based on the CI hint for the memory line.

In another aspect, a method for providing memory bandwidth compression is provided. The method comprises receiving, by a compressed memory controller, a memory write request comprising write data and a physical address of a memory line in a system memory. The method further comprises determining a compression pattern for the write data. The method also comprises generating a CI for the write data based on the compression pattern. The method additionally comprises writing the write data to the memory line in the system memory. The method further comprises writing the generated CI into one or more ECC bits of the memory line of the system memory. The method also comprises, in parallel with writing the write data to the memory line in the system memory, determining whether the physical address corresponds to a CI hint directory entry of a plurality of CI hint directory entries of a CI hint directory of the compressed memory controller. The method additionally comprises, responsive to determining that the physical address corresponds to a CI hint directory entry of the plurality of CI hint directory entries of the CI hint directory, updating a CI hint of a plurality of CI hints of the CI hint directory entry corresponding to the memory line based on the generated CI.

In another aspect, a compressed memory controller is provided. The compressed memory controller comprises a means for receiving a memory read request comprising a physical address of a memory line in a system memory. The compressed memory controller further comprises a means for initiating a memory read transaction comprising a requested read length value to the system memory based on the physical address. The compressed memory controller also comprises a means for determining whether the physical address corresponds to a CI hint directory entry of a plurality of CI hint directory entries of a CI hint directory of the compressed memory controller, in parallel with initiating the memory read transaction. The compressed memory controller additionally comprises a means for reading a CI hint of a plurality of CI hints for the memory line from the CI hint directory entry, responsive to determining that the physical address corresponds to a CI hint directory entry of the plurality of CI hint directory entries of the CI hint directory of the compressed memory controller. The compressed memory controller further comprises a means for modifying the requested read length value of the memory read transaction based on the CI hint for the memory line, responsive to determining that the physical address corresponds to a CI hint directory entry of the plurality of CI hint directory entries of the CI hint directory of the compressed memory controller In another aspect, a compressed memory controller is provided. The compressed memory controller comprises a means for receiving a memory write request comprising write data and a physical address of a memory line in a system memory. The compressed memory controller further comprises a means for determining a compression pattern for the write data. The compressed memory controller also comprises a means for generating a CI for the write data based on the compression pattern. The compressed memory controller additionally comprises a means for writing the write data to the memory line in the system memory. The compressed memory controller further comprises a means for writing the generated CI into one or more ECC bits of the memory line of the system memory. The compressed memory controller also comprises a means for determining whether the physical address corresponds to a CI hint directory entry of a plurality of CI hint directory entries of a CI hint directory of the compressed memory controller, in parallel with writing the write data to the memory line in the system memory. The compressed memory controller additionally comprises a means for updating a CI hint of a plurality of CI hints of the CI hint directory entry corresponding to the memory line based on the generated CI.

DETAILED DESCRIPTION

Figure 1:
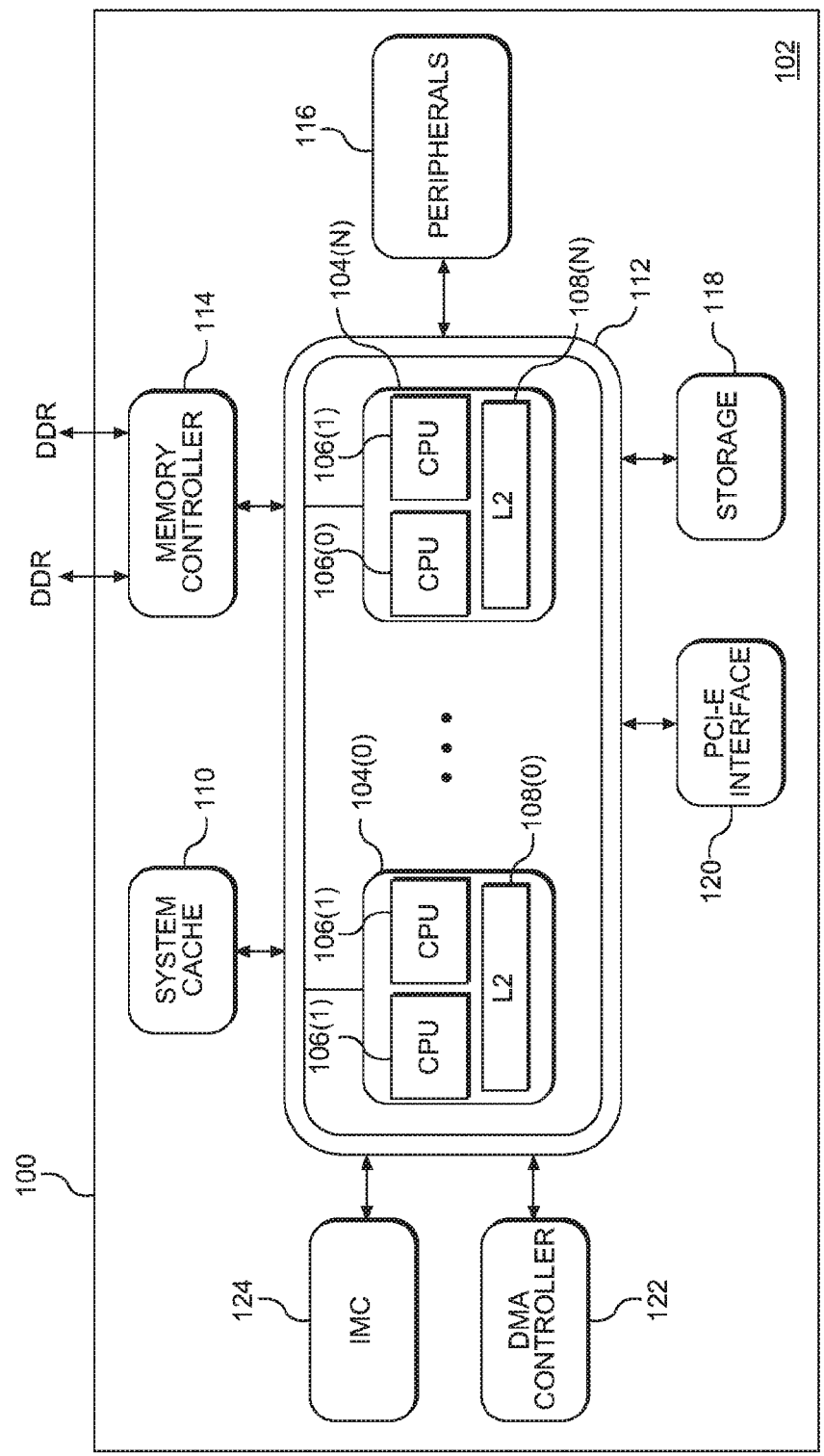
FIG. 1 is a schematic diagram of an exemplary system-on-a-chip (SoC) that includes a central processing unit (CPU)-based system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
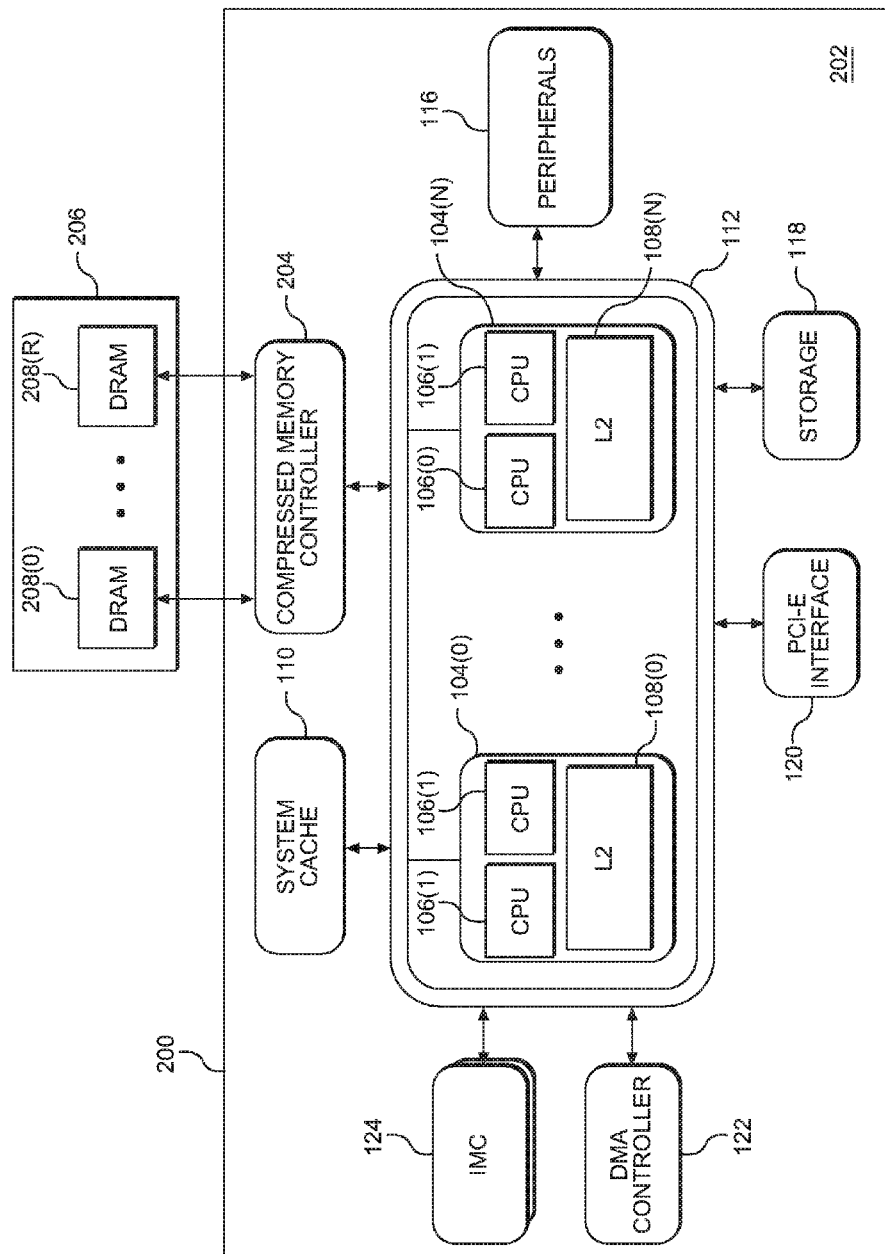
FIG. 2 is a schematic diagram of an SoC that includes an exemplary CPU-based system having a plurality of CPUs and a compressed memory controller configured to provide memory bandwidth compression.

Aspects disclosed herein include providing memory bandwidth compression using compression indicator (CI) hint directories in a central processing unit (CPU)-based system. In some aspects, a compressed memory controller is configured to provide memory bandwidth compression for memory read requests and/or memory write requests. In this regard, FIG. 2 is a schematic diagram of a system-on-a-chip (SoC) 200 that includes a CPU-based system 202 having a plurality of CPU blocks 104(0)-104(N) similar to the CPU-based system 102 in FIG. 1. The CPU-based system 202 in FIG. 2 includes some common components with the CPU-based system 102 in FIG. 1, which are noted by common element numbers between FIGS. 1 and 2. For the sake of brevity, these elements will not be re-described. However, in the CPU-based system 202 in FIG. 2, a compressed memory controller 204 is provided. The compressed memory controller 204 controls access to a system memory 206. The system memory 206 may comprise one or more double data rate (DDR) dynamic random access memories (DRAMs) 208(0)-208(R) (referred to hereinafter as "DRAM 208(0)-208(R)"), as a non-limiting example. The compressed memory controller 204 in this example employs memory bandwidth compression according to the aspects disclosed herein and below. Similar to the memory controller 114 of the CPU-based system 102 in FIG. 1, the compressed memory controller 204 in the CPU-based system 202 in FIG. 2 is shared by the CPU blocks 104(0)-104(N) through the internal system bus 112.

Figure 3:
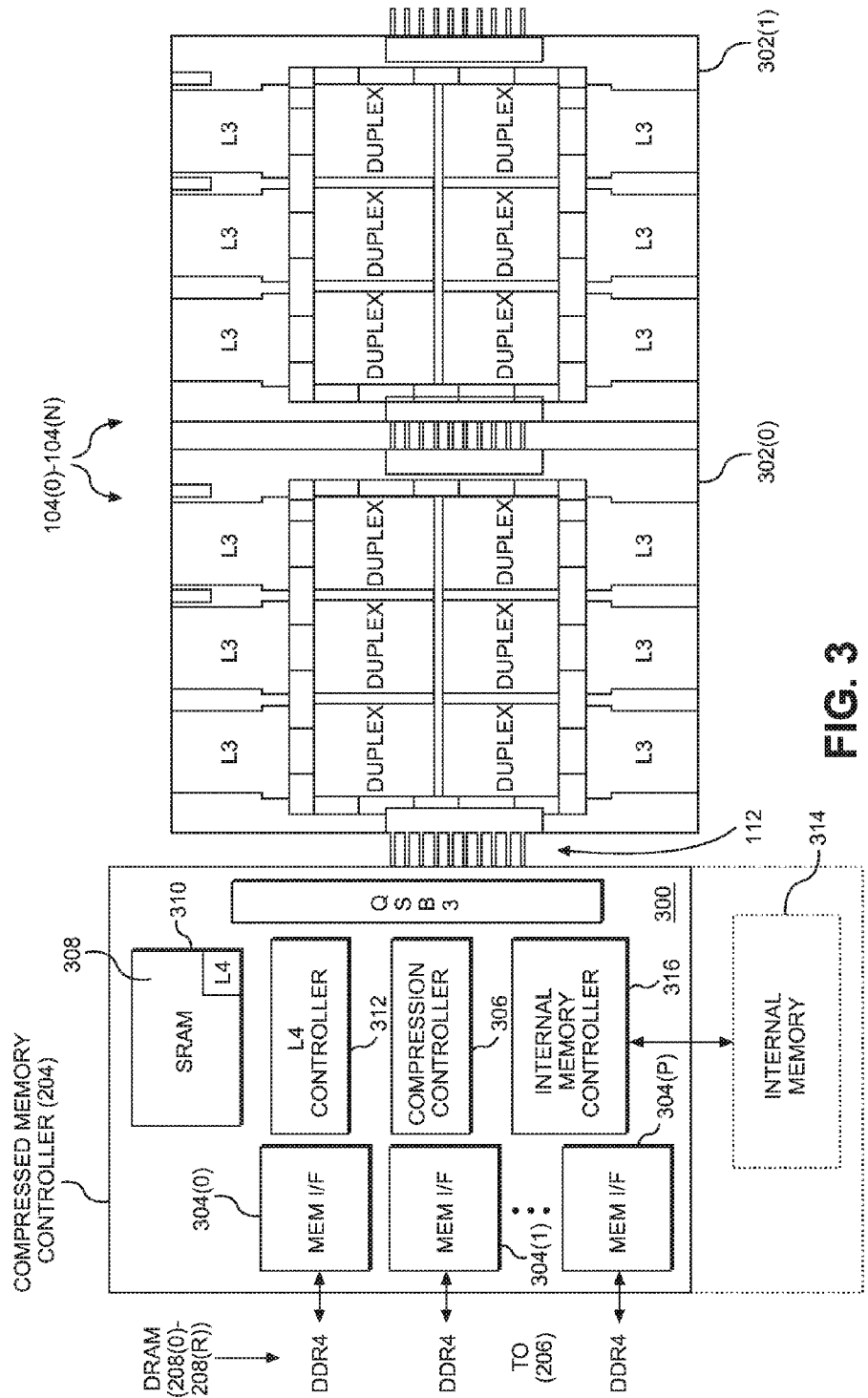
FIG. 3 is a more detailed schematic diagram of the compressed memory controller in FIG. 2, wherein the compressed memory controller is further communicatively coupled to an optional, internal memory that may be employed to provide memory bandwidth compression.

To illustrate a more detailed schematic diagram of exemplary internal components of the compressed memory controller 204 in FIG. 2, FIG. 3 is provided. In this example, the compressed memory controller 204 is provided on a separate semiconductor die 300 from semiconductor dies 302(0), 302(1) that contain the CPU blocks 104(0)-104(N) in FIGS. 1 and 2. Alternatively, in some aspects the compressed memory controller 204 may be included in a common semiconductor die (not shown) with the CPU blocks 104(0)-104(N). Regardless of the die configurations, the compressed memory controller 204 is provided such that the CPU blocks 104(0)-104(N) may make memory access requests via the internal system bus 112 to the compressed memory controller 204, and receive data from memory through the compressed memory controller 204.

With continuing reference to FIG. 3, the compressed memory controller 204 controls operations for memory accesses to the system memory 206, which is shown in FIGS. 2 and 3 as comprising DRAM 208(0)-208(R). The compressed memory controller 204 includes a plurality of memory interfaces (MEM I/Fs) 304(0)-304(P) (e.g., DDR DRAM interfaces) used to service memory access requests. In this regard, the compressed memory controller 204 in this example includes a compression controller 306. The compression controller 306 controls the compression of data stored to the system memory 206 and the decompression of data retrieved from the system memory 206 in response to memory access requests from the CPU blocks 104(0)-104(N). The compression controller 306 can be configured to perform memory bandwidth compression of information provided over the internal system bus 112 to the CPU blocks 104(0)-104(N).

As will be discussed in more detail below, the compression controller 306 can perform any number of compression techniques and algorithms to provide memory bandwidth compression. A local memory 308 is provided for data structures and other information needed by the compression controller 306 to perform such compression techniques and algorithms. In this regard, the local memory 308 is provided in the form of a static random access memory (SRAM) 310. The local memory 308 is of sufficient size to be used for data structures and other data storage that may be needed for the compression controller 306 to perform compression techniques and algorithms. The local memory 308 may also be partitioned to contain a cache, such as a Level 4 (L4) cache, to provide additional cache memory for internal use within the compressed memory controller 204. Thus, an L4 controller 312 may also be provided in the compressed memory controller 204 to provide access to the L4 cache. Enhanced compression techniques and algorithms may require a larger internal memory. For example, the local memory 308 may provide 128 kilobytes (kB) of memory.

Further, as shown in FIG. 3, an optional, additional internal memory 314 can also be provided for the compressed memory controller 204. The additional internal memory 314 may be provided as DRAM, as an example. The additional internal memory 314 can facilitate additional or greater amounts of storage of data structures and other data than in the local memory 308 for the compressed memory controller 204 providing memory bandwidth compression and decompression mechanisms to increase the memory bandwidth compression of the CPU-based system 202. An internal memory controller 316 is provided in the compressed memory controller 204 to control memory accesses to the additional internal memory 314 for use in compression. The internal memory controller 316 is not accessible or viewable to the CPU blocks 104(0)-104(N).

As noted above, the compressed memory controller 204 in FIG. 3 may perform memory bandwidth compression, including, in some aspects, zero-line compression. The local memory 308 can be used to store larger data structures used for such compression. As discussed in greater detail below, memory bandwidth compression may reduce memory access latency and allow more CPUs 106(0), 106(1) or their respective threads to access a same number of memory channels while minimizing the impact to memory access latency. In some aspects, the number of memory channels may be reduced while achieving similar latency results as compared to a greater number of memory channels if such compression was not performed by the compressed memory controller 204, which may result in reduced system level power consumption.

Each of the resources provided for memory bandwidth compression in the compressed memory controller 204 in FIG. 3, including the local memory 308 and the additional internal memory 314, can be used individually or in conjunction with each other to achieve the desired balance among resources and area, power consumption, increased memory capacity through memory capacity compression, and increased performance through memory bandwidth compression. Memory bandwidth compression can be enabled or disabled, as desired. Further, the resources described above for use by the compressed memory controller 204 can be enabled or disabled to achieve the desired tradeoffs among memory capacity and/or bandwidth compression efficiency, power consumption, and performance. Exemplary memory bandwidth compression techniques using these resources available to the compressed memory controller 204 will now be discussed.

In particular, and as noted above, some memory bandwidth compression schemes may make use of a master directory to track a compression status for each memory line of a system memory. However, the master directory employed by such memory bandwidth compression schemes may consume an unacceptably large portion of the system memory, may require implementation of additional logic, and/or may incur additional latency for any memory access request. Other memory bandwidth compression mechanisms may use spare bits in an error correcting code (ECC) field to indicate the compression status for each memory line of a system memory. While such mechanisms may avoid the need for a master directory, they may sacrifice some memory access performance, as the compression state for each memory line of the system memory may not be determined until after an initial read of the memory line is complete. Thus, it is desirable to provide a memory bandwidth compression mechanism that avoids the drawbacks of using a master directory while providing improved memory access performance.

Figure 4A:
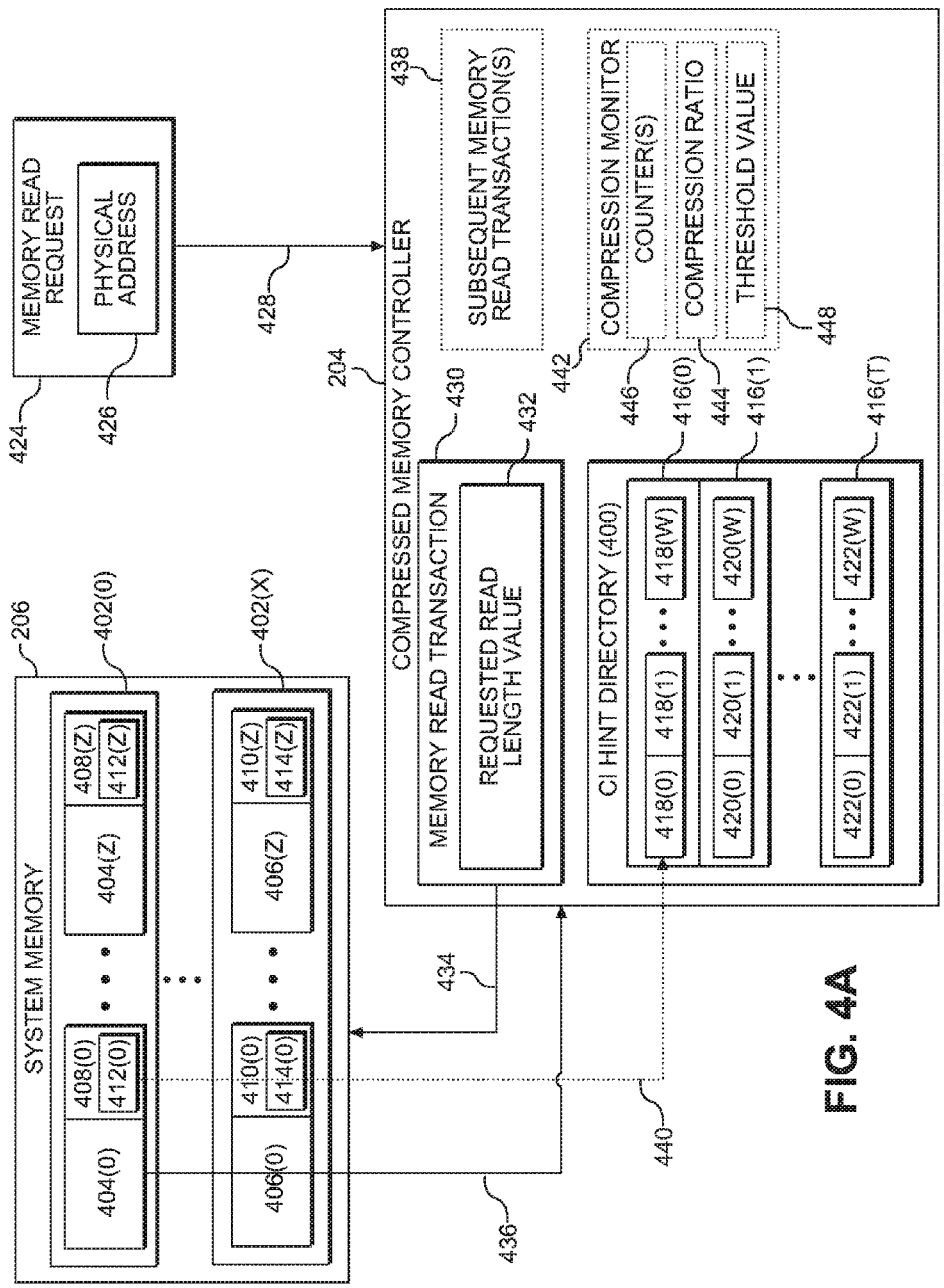
FIGS. 4A and 4B are diagrams illustrating exemplary communications flows during memory read operations and memory write operations, respectively, and exemplary elements of a compression indicator (CI) hint directory provided by the compressed memory controller in FIG. 2 for providing memory bandwidth compression.
Figure 4B:
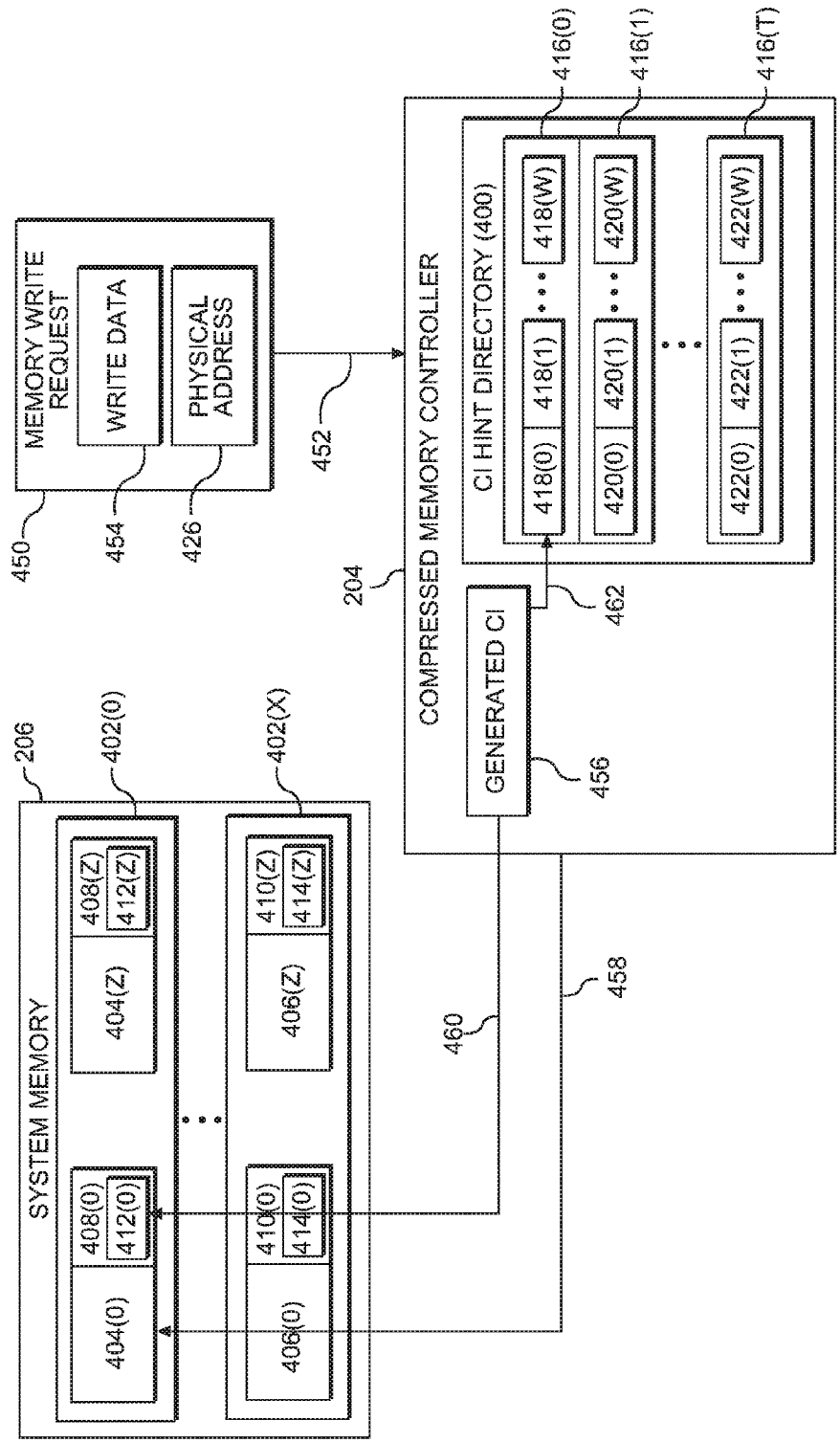

In this regard, FIGS. 4A and 4B are provided to illustrate exemplary communications flows and exemplary elements of the system memory 206 and the compressed memory controller 204 for providing memory bandwidth compression using a CI hint directory 400. In particular, FIG. 4A illustrates exemplary communications flows during a memory read operation using the CI hint directory 400 of the compressed memory controller 204, while FIG. 4B illustrates exemplary communications flows during a memory write operation using the CI hint directory 400 of the compressed memory controller 204. In describing FIGS. 4A and 4B, elements of FIGS. 2 and 3 are referenced for the sake of clarity.

As seen in FIGS. 4A and 4B, the system memory 206 includes a plurality of memory lines 402(0)-402(X) for storing compressed and uncompressed data. The memory lines 402(0)-402(X) are each subdivided into respective memory blocks 404(0)-404(Z) and 406(0)-406(Z), as determined by an underlying memory architecture of the system memory 206. In some aspects, the size of each of the memory blocks 404(0)-404(Z), 406(0)-406(Z) represents a smallest amount of data (i.e., "memory access granularity") that may be read from or written to the system memory 206 in a memory operation. For example, in some exemplary memory architectures, each of the memory lines 402(0)-402(X) may comprise 128 bytes of data, subdivided into two 64-byte memory blocks 404(0)-404(Z), 406(0)-406(Z). Some aspects may provide that each of the memory lines 402(0)-402(X) may comprise more or fewer bytes of data (e.g., 256 bytes or 64 bytes, as non-limiting examples). Similarly, according to some aspects, the memory blocks 404(0)-404(Z), 406(0)-406(Z) within the memory lines 402(0)-402(X) may be larger or smaller (e.g., 128 bytes or 32 bytes, as non-limiting examples). In some aspects, a memory read operation may read fewer bytes than the size of each of the memory blocks 404(0)-404(Z), 406(0)-406(Z), but still consume the same amount of memory bandwidth as one of the memory blocks 404(0)-404(Z), 406(0)-406(Z).

Each of the memory blocks 404(0)-404(Z), 406(0)-406(Z) is associated with one or more corresponding ECC bits 408(0)-408(Z), 410(0)-410(Z). ECC bits such as the ECC bits 408(0)-408(Z), 410(0)-410(Z) are used conventionally to detect and correct commonly encountered types of internal data corruption within the memory blocks 404(0)-404(Z), 406(0)-406(Z). In the example of FIGS. 4A and 4B, one or more of the ECC bits 408(0)-408(Z), 410(0)-410(Z) are repurposed to store CIs 412(0)-412(Z), 414(0)-414(Z) for the respective memory blocks 404(0)-404(Z), 406(0)-406(Z). Although the ECC bits 408(0)-408(Z), 410(0)-410(Z) in FIGS. 4A and 4B are depicted as being adjacent to their respective memory blocks 404(0)-404(Z), 406(0)-406(Z), it is to be understood that the ECC bits 408(0)-408(Z), 410(0)-410(Z) may be located elsewhere within the system memory 206. It is to be further understood that the CIs 412(0)-412(Z), 414(0)-414(Z) are described as being stored in the ECC bits 408(0)-408(Z), 410(0)-410(Z) as a non-limiting example only, and that some aspects may provide that the CIs 412(0)-412(Z), 414(0)-414(Z) are stored in memory locations other than the ECC bits 408(0)-408(Z), 410(0)-410(Z).

The CIs 412(0)-412(Z), 414(0)-414(Z) each may comprise one or more bits that indicate a compression status of data stored at a corresponding memory block 404(0)-404(Z), 406(0)-406(Z) of the system memory 206. In some aspects, each of the CIs 412(0)-412(Z), 414(0)-414(Z) may comprise a single bit indicating whether data in the corresponding memory block 404(0)-404(Z), 406(0)-406(Z) is compressed or uncompressed. According to some aspects, each of the CIs 412(0)-412(Z), 414(0)-414(Z) may comprise multiple bits that may be used to indicate a compression pattern (e.g., a number of the memory blocks 404(0)-404(Z), 406(0)-406(Z) occupied by the compressed data, as a non-limiting example) for each of the corresponding memory blocks 404(0)-404(Z), 406(0)-406(Z).

To provide memory bandwidth compression, the compressed memory controller 204 provides the CI hint directory 400. The CI hint directory 400 includes a plurality of CI hint directory entries 416(0)-416(T). Each of the plurality of CI hint directory entries 416(0)-416(T) stores a plurality of CI hints 418(0)-418(W), 420(0)-420(W), 422(0)-422(W). The CI hints 418(0)-418(W), 420(0)-420(W), 422(0)-422(W) each correspond to a memory line 402(0)-402(X), and provide an indication of the compression state of the corresponding memory line 402(0)-402(X). In some aspects, the CI hints 418(0)-418(W), 420(0)-420(W), 422(0)-422(W) correspond to contiguous memory lines 402(0)-402(X). In this manner, locality of memory accesses may improve the hit rate (relative to accessing the CI hints 418(0)-418(W), 420(0)-420(W), 422(0)-422(W) for non-contiguous memory lines 402(0)-402(X)) when querying the CI hint directory 400. According to some aspects, the number of CI hints 418(0)-418(W), 420(0)-420(W), 422(0)-422(W) per CI hint directory entry 416(0)-416(T) may be selected to optimize a memory access granularity of the system memory 206. As a non-limiting example, if the memory access granularity of the system memory 206 is 64 bytes, the CI hint directory 400 may be configured to store 64 bytes of CI hints 418(0)-418(W), 420(0)-420(W), 422(0)-422(W) in each CI hint directory entry 416(0)-416(T).

In an exemplary aspect, each of the CI hints 418(0)-418(W), 420(0)-420(W), 422(0)-422(W) comprises a two (2) bit value providing four (4) possible indications: the corresponding memory line 402(0)-402(X) comprises a specified pattern (e.g., all zeroes, as a non-limiting example); is known to be compressed; is known to be uncompressed; or has a compression state that is unknown. Some aspects may provide that each of the CI hints 418(0)-418(W), 420(0)-420(W), 422(0)-422(W) comprises a one (1) bit value providing two (2) possible indications: the corresponding memory line 402(0)-402(X) is known to be compressed or uncompressed (depending on the implementation of the compressed memory controller 204); or has a compression state that is unknown. In aspects in which multiple levels of compression are supported, each of the CI hints 418(0)-418(W), 420(0)-420(W), 422(0)-422(W) may comprise more than two (2) bits, and may indicate multiple levels of compression of the corresponding memory line 402(0)-402(X) in addition to the above-noted indications.

In the example of FIG. 4A, a memory read request 424 specifying a physical address 426 is received by the compressed memory controller 204, as indicated by arrow 428. For purposes of illustration, it is assumed in this example that the physical address 426 corresponds to the memory block 404(0), which is a 64-byte subdivision of the 128-byte memory line 402(0). At the time the memory read request 424 is received, the compressed memory controller 204 is unaware of whether the data stored at the memory block 404(0) is compressed or not. The compressed memory controller 204 could proceed with reading the entire memory line 402(0), but if the requested data is stored in a compressed form in only the memory block 404(0), a read of the memory block 404(Z) would be unnecessary, and would result in increased memory access latency. Alternatively, the compressed memory controller 204 could read only the memory block 404(0), determine based on the corresponding CI 412(0) whether the data stored therein is compressed or not, and then read the memory block 404(Z) if the data is uncompressed. However, this approach produces increased memory access latency resulting from issuing the two (2) separate memory read operations. Thus, without knowing the compression status of the memory block 404(0), the compressed memory controller 204 risks executing unnecessary memory read operations that may negatively impact memory bandwidth. The compressed memory controller 204 may also incur additional memory read latency by waiting to issue a second memory read transaction until the compression state of the memory block 404(0) is known.

Accordingly, upon receiving the memory read request 424, the compressed memory controller 204 issues a memory read transaction 430 to the system memory 206. The memory read transaction 430 includes a requested read length value 432 that indicates how many memory blocks 404(0)-404(Z), 406(0)-406(Z) to read from the system memory 206. For example, in aspects in which each memory line 402(0)-402(X) is 128 bytes long and comprises two 64-byte memory blocks 404(0)-404(Z), 406(0)-406(Z), the requested read length value 432 may indicate that only 64 bytes are to be read as part of the memory read transaction 430, or the requested read length value 432 may indicate that all 128 bytes of one of the memory lines 402(0)-402(X) are to be read. As discussed in greater detail below, the compressed memory controller 204 may select a requested read length value 432 based on tracking a ratio of compressed memory read operations to a total number of read operations, and/or a ratio of compressed memory write operations to a total number of write operations. If the tracking indicates to the compressed memory controller 204 that memory reads and/or writes tend to access compressed data more than uncompressed data, the compressed memory controller 204 may opt to use a smaller requested read length value 432 (e.g., 64 bytes). Conversely, if the tracking indicates to the compressed memory controller 204 that memory reads and/or writes tend to access uncompressed data, the compressed memory controller 204 may opt to use a larger requested read length value 432 (e.g., 128 bytes).

The memory read transaction 430 may have to proceed through a number of pipeline stages (not shown) within the compressed memory controller 204 before actually issuing to the system memory 206. Thus, while the memory read transaction 430 is being processed, the compressed memory controller 204, in parallel with issuing the memory read transaction 430, also accesses the CI hint directory 400 to determine whether a CI hint directory entry 416(0)-416(T) stored therein corresponds to the physical address 426 of the memory read request 424. If so (i.e., a "hit" on the CI hint directory 400), the compressed memory controller 204 reads one of the CI hints 418(0)-418(W), 420(0)-420(W), 422(0)-422(W) corresponding to the memory line 402(0). In this example, the CI hint 418(0) corresponds to the memory line 402(0).

Based on the CI hint 418(0), the compressed memory controller 204 determines whether and how to attempt to modify the requested read length value 432 of the pending memory read transaction 430. In some aspects, for instance, the CI hint 418(0) may indicate that the memory line 402(0) comprises a specified pattern (i.e., the entire memory line 402(0) stores values of zero (0)). In this case, the compressed memory controller 204 may immediately return the specified pattern in response to the memory read request 424. If the memory read transaction 430 has not yet been issued, the compressed memory controller 204 may cancel the memory read transaction 430, thus saving memory bandwidth that would otherwise be wasted. Otherwise, if the memory read transaction 430 has already issued, as indicated by arrow 434, the compressed memory controller 204 may discard a subsequent response, represented by arrow 436, from the system memory 206 in response to the memory read transaction 430.

Some aspects may provide that the CI hint 418(0) may indicate that the memory line 402(0) is known to be compressed. In such cases, memory bandwidth may be conserved by ensuring that the requested read length value 432 of the pending memory read transaction 430 is not larger than necessary. For example, if the requested read length value 432 of the memory read transaction 430 is 128 bytes, but the CI hint 418(0) indicates that the memory line 402(0) is known to be compressed (i.e., into 64 bytes), the extra 64 bytes to be read as part of the memory read transaction 430 represent unnecessary overhead. Accordingly, the compressed memory controller 204 may compare a compressed length of the memory line 402(0) with the requested read length value 432. If the compressed length of the memory line 402(0) is not less than the requested read length value 432 (or if the memory read transaction 430 has already issued), the memory read transaction 430 is allowed to proceed as issued. However, if the compressed length of the memory line 402(0) is less than the requested read length value 432 (and the memory read transaction 430 has not issued), the compressed memory controller 204 may modify the requested read length value 432 of the memory read transaction 430 to correspond to the compressed length of the memory line 402(0). In the example above, for instance, the compressed memory controller 204 may modify the requested read length value 432 from 128 bytes to 64 bytes.

According to some aspects, the CI hint 418(0) may indicate that the memory line 402(0) is known to be uncompressed. As a result, memory read latency may be reduced by ensuring that the requested read length value 432 of the pending memory read transaction 430 is large enough to ensure that the entire memory line 402(0) is read by the memory read transaction 430. For example, if the requested read length value 432 of the memory read transaction 430 is 64 bytes, but the CI hint 418(0) indicates that the memory line 402(0) is known to be uncompressed (i.e., 128 bytes), a second memory read transaction (not shown) will be required to retrieve the entire memory line 402(0). Accordingly, the compressed memory controller 204 may compare a length of the memory line 402(0) with the requested read length value 432. If the length of the memory line 402(0) is not greater than the requested read length value 432, the memory read transaction 430 is allowed to proceed as issued. However, if the length of the memory line 402(0) is greater than the requested read length value 432 (and the memory read transaction 430 has not issued), the compressed memory controller 204 may modify the requested read length value 432 of the memory read transaction 430 to correspond to the length of the memory line 402(0). For instance, the compressed memory controller 204 in the example above may modify the requested read length value 432 from 64 bytes to 128 bytes. If the memory read transaction 430 has already issued, the compressed memory controller 204 may still reduce memory read latency by immediately issuing at least one subsequent memory read transaction 438, without waiting for the memory read transaction 430 to complete.

In some aspects, the CI hint 418(0) may indicate that a compression state of the memory line 402(0) is unknown. Because the compressed memory controller 204 has no information on which to base a potential optimization of the requested read length value 432, the memory read transaction 430 proceeds with the requested read length value 432 unmodified. However, upon completion of the memory read transaction 430, the compressed memory controller 204 in some aspects may read the CI 412(0) stored in the ECC bits 408(0) associated with the memory line 402(0), as indicated by arrow 440. The compressed memory controller 204 may then update the CI hint 418(0) based on the CI 412(0). In this manner, subsequent reads to the memory line 402(0) may be able to use the CI hint 418(0) to optimize the requested read length value 432. According to some aspects, reading the CI 412(0) and updating the CI hint 418(0) may also take place in each of the scenarios described above with respect to the memory line 402(0) comprising a specified pattern or being known to be compressed or uncompressed.

In some aspects, the compressed memory controller 204 may further improve memory access latency by providing an adaptive mode in which the number of reads and/or writes of the compressed data compared to the total number of reads and/or writes may be tracked, and operations for carrying out read operations may be selectively modified based on such tracking. The results of such tracking may then be used by the compressed memory controller 204 to select an appropriate requested read length value 432. According to some aspects, such tracking may be carried out on a per-CPU basis, a per-workload basis, a per-virtual-machine (VM) basis, a per-container basis, and/or on a per-Quality-of-Service (QoS)-identifier (QoSID) basis, as non-limiting examples.

In this regard, the compressed memory controller 204, in some aspects, may be configured to provide a compression monitor 442. The compression monitor 442 is configured to track a compression ratio 444 based on at least one of a number of reads of compressed data, a total number of read operations, a number of writes of compressed data, and a total number of write operations, as non-limiting examples. In some aspects, the compression monitor 442 may provide one or more counters 446 for tracking the number of reads of the compressed data, the total number of the read operations, the number of writes of the compressed data, and/or the total number of the write operations carried out by the compressed memory controller 204. The compression ratio 444 may then be determined as a ratio of total read operations to compressed read operations and/or a ratio of total write operations to compressed write operations.

The compressed memory controller 204 may further provide a threshold value 448 with which the compression ratio 444 may be compared by the compression monitor 442. If the compression ratio 444 is not below the threshold value 448, the compressed memory controller 204 may conclude that data to be read is likely to be compressed, and may select a smaller requested read length value 432 as described above. However, if the compression ratio 444 is below the threshold value 448, the compressed memory controller 204 may determine that data to be read is less likely to be compressed. Consequently, the compressed memory controller 204 may select a larger requested read length value 432 as noted above.

If the compressed memory controller 204 determines that the physical address 426 does not correspond to any of the plurality of CI hint directory entries 416(0)-416(T) of the CI hint directory 400 (i.e., a "miss" on the CI hint directory 400), the compressed memory controller 204 in some aspects may evict an existing CI hint directory entry 416(0) of the plurality of CI hint directory entries 416(0)-416(T) of the CI hint directory 400, and install a new CI hint directory entry 416(0). The plurality of CI hints 418(0)-418(W) of the new CI hint directory entry 416(0) are then initialized to indicate that a compression state of each corresponding memory line 402(0)-402(X) is unknown. After the memory read transaction 430 completes, the compressed memory controller 204 may read a CI 412(0) stored in one or more of the ECC bits 408(0)-408(Z) associated with the memory line 402(0), and may update the CI hint 418(0) corresponding to the memory line 402(0) within the new CI hint directory entry 416(0) based on the CI 412(0).

Referring now to FIG. 4B, the compressed memory controller 204 in some aspects receives a memory write request 450, as indicated by arrow 452. The memory write request 450 includes both write data 454 to be written to the system memory 206, as well as the physical address 426 of the system memory 206 to which the write data 454 is to be written. For purposes of illustration, it is again assumed that the physical address 426 corresponds to the memory block 404(0). Upon receiving the memory write request 450, the compressed memory controller 204 may carry out operations to compress the write data 454, and based on the results of compressing the write data 454, may determine a compression pattern for the write data 454. The compression pattern may indicate, as non-limiting examples, whether or not the write data 454 was successfully compressed, and/or a number of memory blocks 404(0)-404(Z), 406(0)-406(Z) to be occupied by the compressed write data 454. Based on the compression pattern, the compressed memory controller 204 generates a CI 456 for the write data 454.

The compressed memory controller 204 may then write the write data 454 to one or more of the memory blocks 404(0)-404(Z), as indicated by arrow 458. The compressed memory controller 204 also writes the generated CI 456 into the CIs 412(0)-412(Z). As a non-limiting example, the CIs 412(0)-412(Z) may be stored in the ECC bits 408(0)-408(Z) of the one or more memory blocks 404(0)-404(Z) to which the write data 454 was written, as indicated by arrow 460. In some aspects, the CIs 412(0)-412(Z) may be stored using another memory storage mechanism. In parallel with writing the write data 454, the compressed memory controller 204 also accesses the CI hint directory 400 to determine whether a CI hint directory entry 416(0)-416(T) stored therein corresponds to the physical address 426 of the memory write request 450. If so (i.e., a "hit" on the CI hint directory 400), the compressed memory controller 204 updates one of the CI hints 418(0)-418(W), 420(0)-420(W), 422(0)-422(W) corresponding to the memory line 402(0) based on the generated CI 456. In this example, the compressed memory controller 204 updates the CI hint 418(0) corresponding to the memory line 402(0), as indicated by arrow 462.

A "miss" on the CI hint directory 400 is handled in much the same way as described above with respect to FIG. 4A. In response to a miss, the compressed memory controller 204 in some aspects may evict an existing CI hint directory entry 416(0) of the plurality of CI hint directory entries 416(0)-416(T) of the CI hint directory 400, and install a new CI hint directory entry 416(0). The plurality of CI hints 418(0)-418(W) of the new CI hint directory entry 416(0) are then initialized to indicate that a compression state of each corresponding memory line 402(0)-402(X) is unknown. The compressed memory controller 204 may read the CI 412(0) stored in one or more of the ECC bits 408(0)-408(Z) associated with the memory line 402(0), and may update the CI hint 418(0) corresponding to the memory line 402(0) within the new CI hint directory entry 416(0) based on the CI 412(0).

Figure 5:
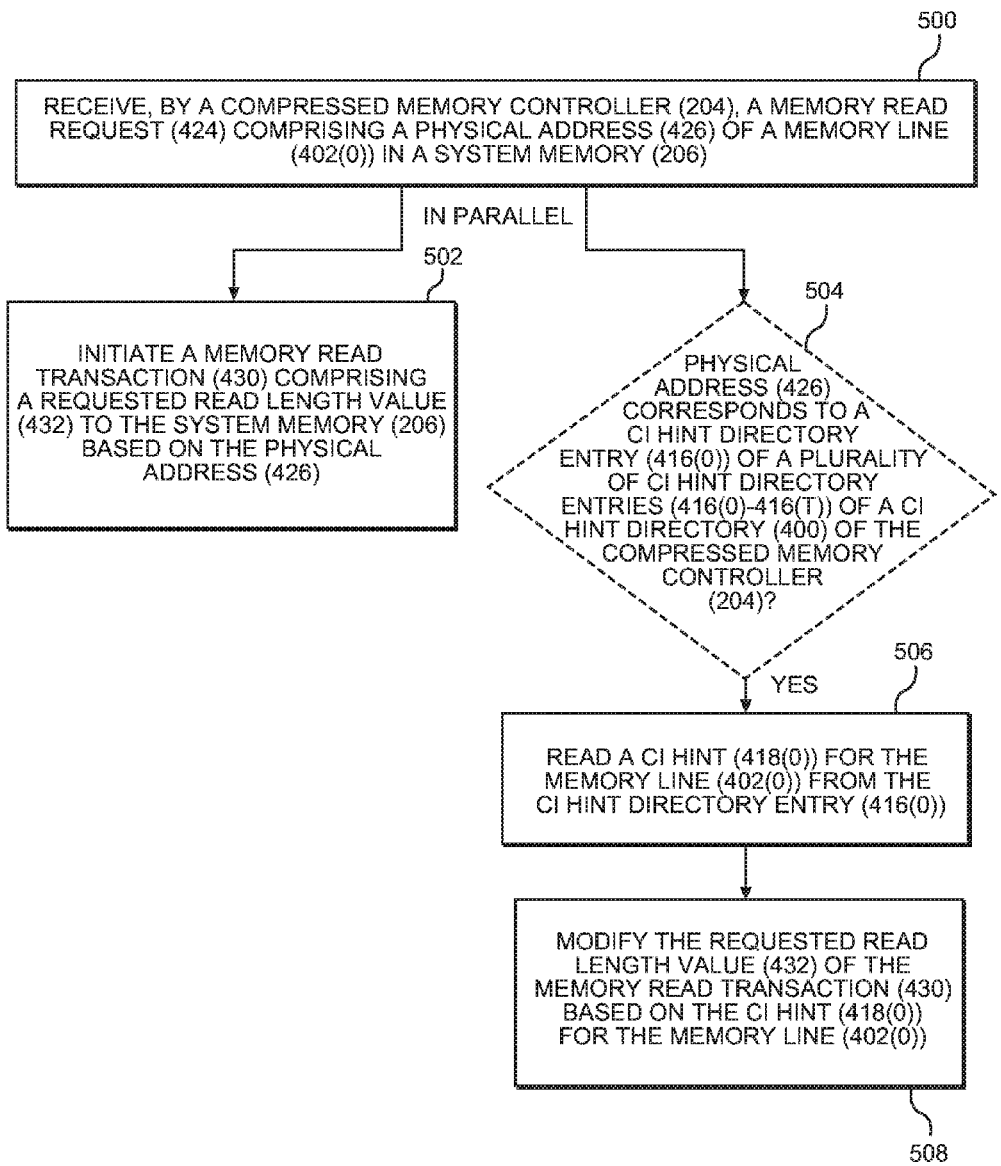
FIG. 5 is a flowchart illustrating exemplary operations for performing a memory read operation by the compressed memory controller in FIG. 2 using memory bandwidth compression.

FIG. 5 is a flowchart illustrating exemplary operations for performing a memory read operation by the compressed memory controller 204 of FIG. 2 using the CI hint directory 400 of FIGS. 4A and 4B. For the sake of clarity, elements of FIGS. 2, 4A, and 4B are referenced in describing FIG. 5. Operations in FIG. 5 begin with the compressed memory controller 204 receiving a memory read request 424 comprising a physical address 426 of a memory line 402(0) in a system memory 206 (block 500). In this regard, the compressed memory controller 204 may be referred to herein as "a means for receiving a memory read request comprising a physical address of a memory line in a system memory." The compressed memory controller 204 next initiates a memory read transaction 430 comprising a requested read length value 432 to the system memory 206 based on the physical address 426 (block 502). Accordingly, the compressed memory controller 204 may be referred to herein as "a means for initiating a memory read transaction comprising a requested read length value to the system memory based on the physical address." In parallel with initiating the memory read transaction 430, the compressed memory controller 204 determines whether the physical address 426 corresponds to a CI hint directory entry 416(0) of the plurality of CI hint directory entries 416(0)-416(T) of the CI hint directory 400 of the compressed memory controller 204 (block 504). The compressed memory controller 204 thus may be referred to herein as "a means for determining whether the physical address corresponds to a CI hint directory entry of a plurality of CI hint directory entries of a CI hint directory of the compressed memory controller, in parallel with initiating the memory read transaction."

If the physical address 426 corresponds to a CI hint directory entry 416(0) of the plurality of CI hint directory entries 416(0)-416(T) of the CI hint directory 400 of the compressed memory controller 204 (i.e., a "hit" on the CI hint directory 400), the compressed memory controller 204 reads a CI hint 418(0) for the memory line 402(0) from the CI hint directory entry 416(0) (block 506). In this regard, the compressed memory controller 204 may be referred to herein as "a means for reading a CI hint of a plurality of CI hints for the memory line from the CI hint directory entry, responsive to determining that the physical address corresponds to a CI hint directory entry of the plurality of CI hint directory entries of the CI hint directory of the compressed memory controller." The compressed memory controller 204 then modifies the requested read length value 432 of the memory read transaction 430 based on the CI hint 418(0) for the memory line 402(0) (block 508). Accordingly, the compressed memory controller 204 may be referred to herein as "a means for modifying the requested read length value of the memory read transaction based on the CI hint for the memory line, responsive to determining that the physical address corresponds to a CI hint directory entry of the plurality of CI hint directory entries of the CI hint directory of the compressed memory controller."

Figure 6A:
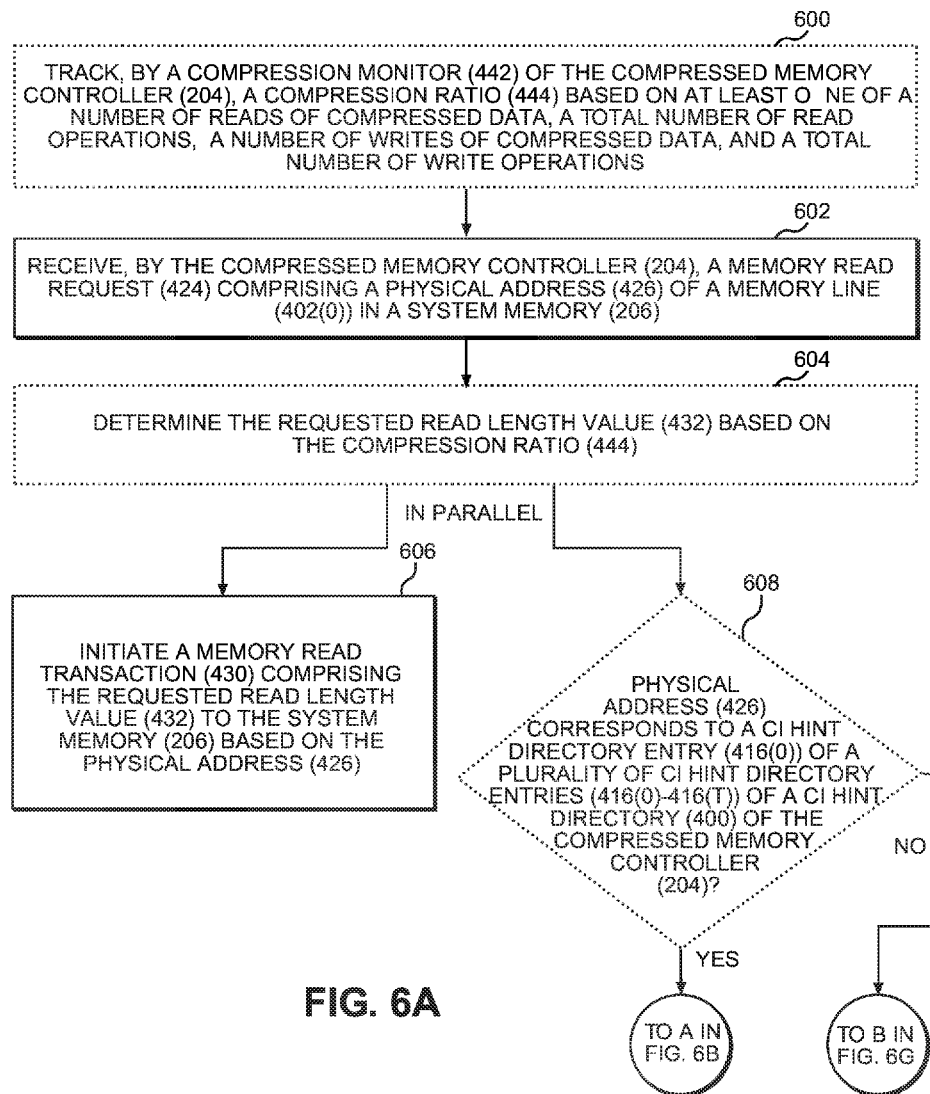
FIGS. 6A-6G are flowcharts illustrating further exemplary operations for performing a memory read operation by the compressed memory controller in FIG. 2 using memory bandwidth compression.
Figure 6B:
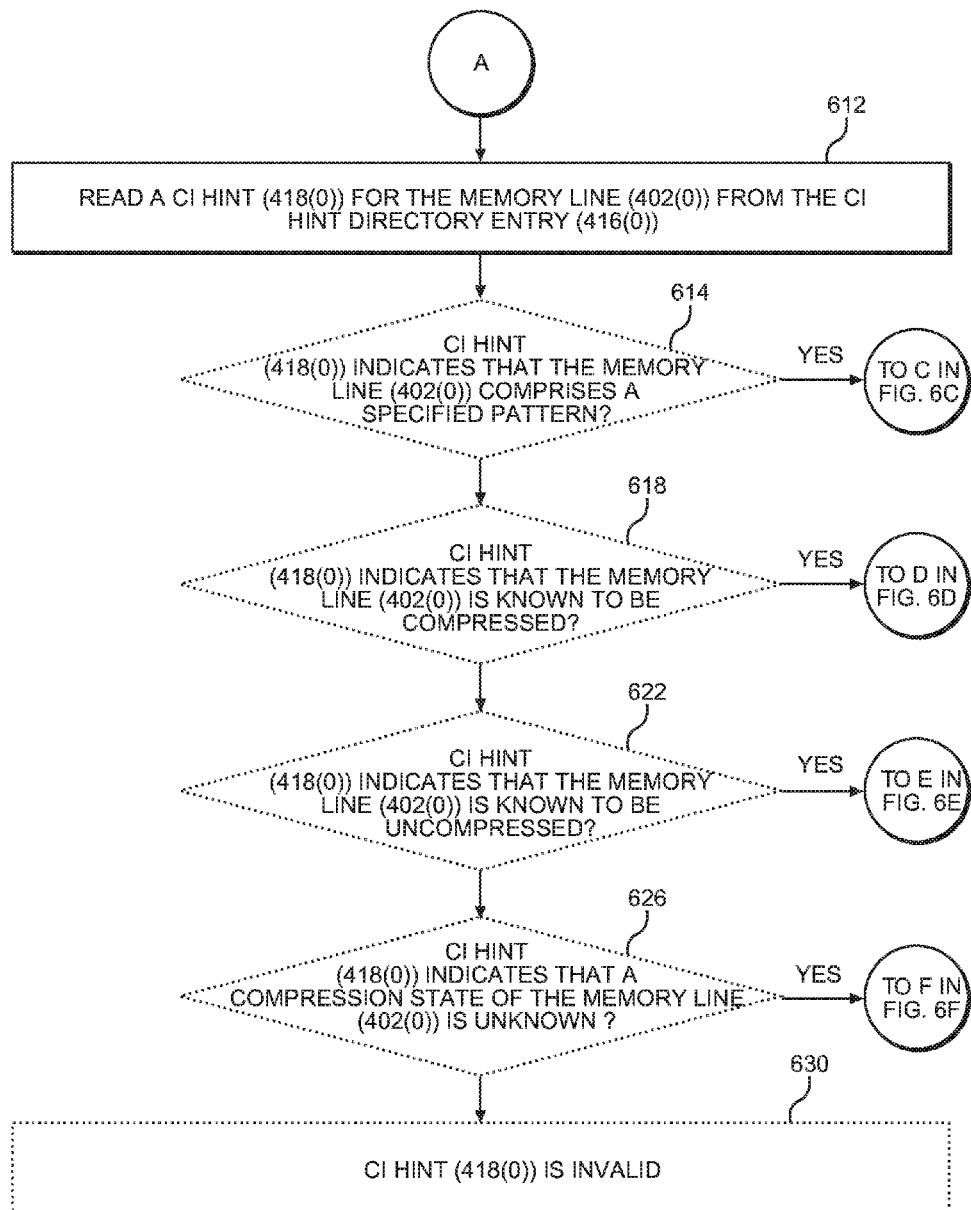
Figure 6C:
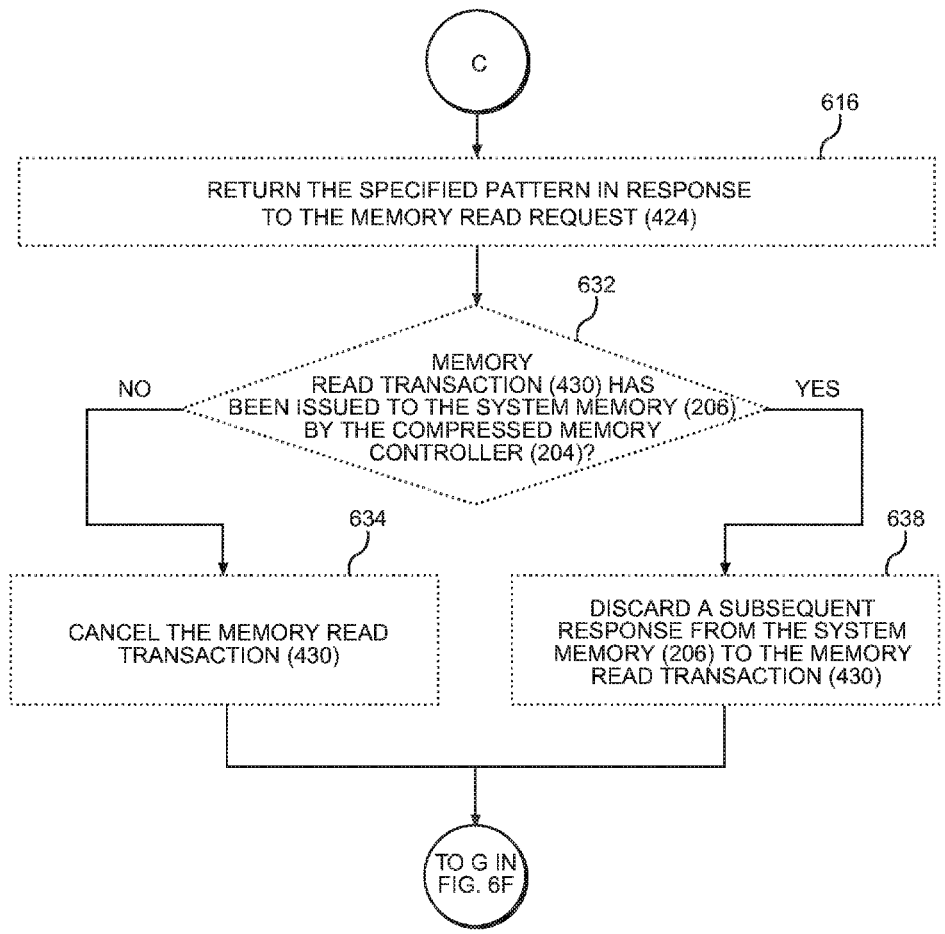
Figure 6D:
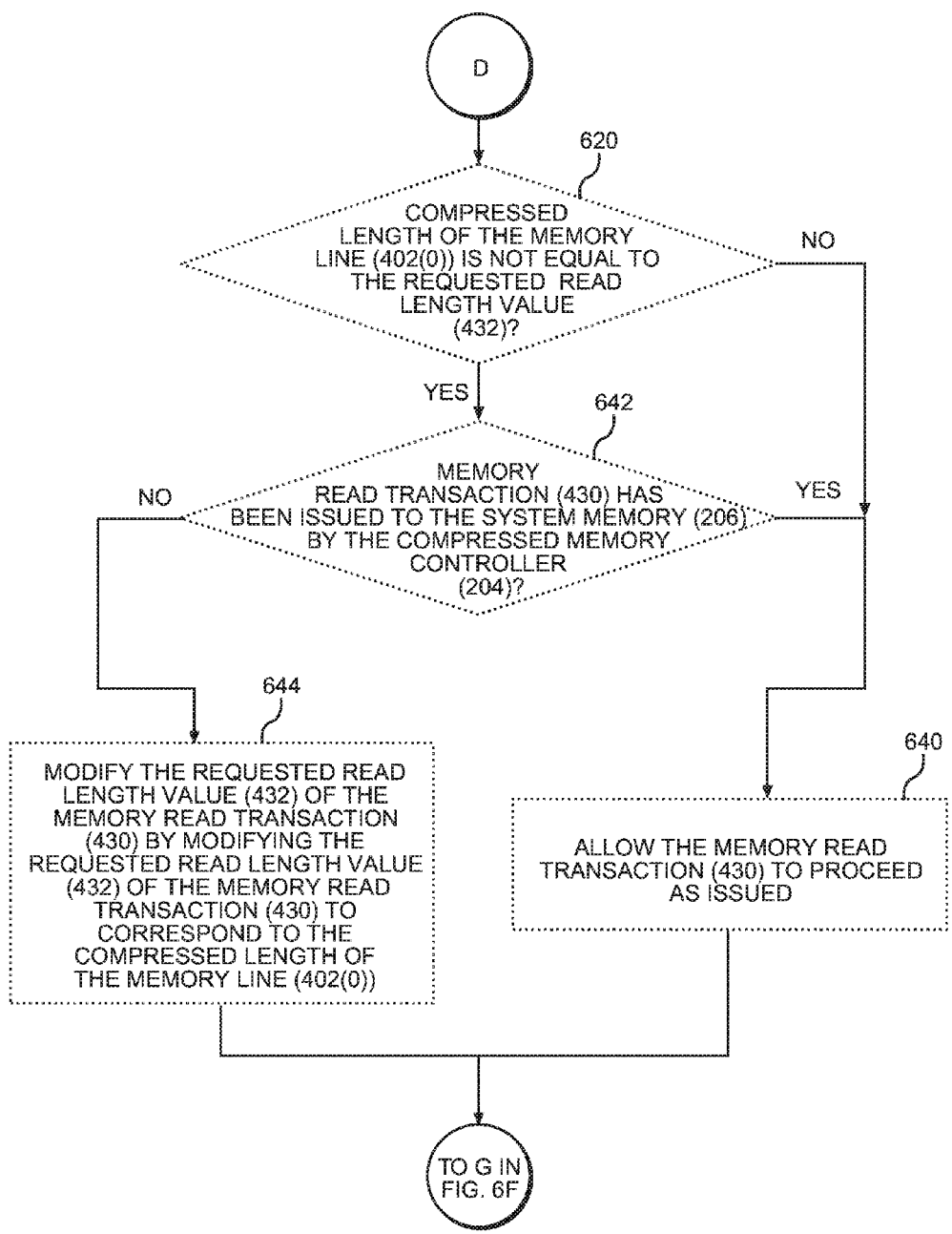
Figure 6E:
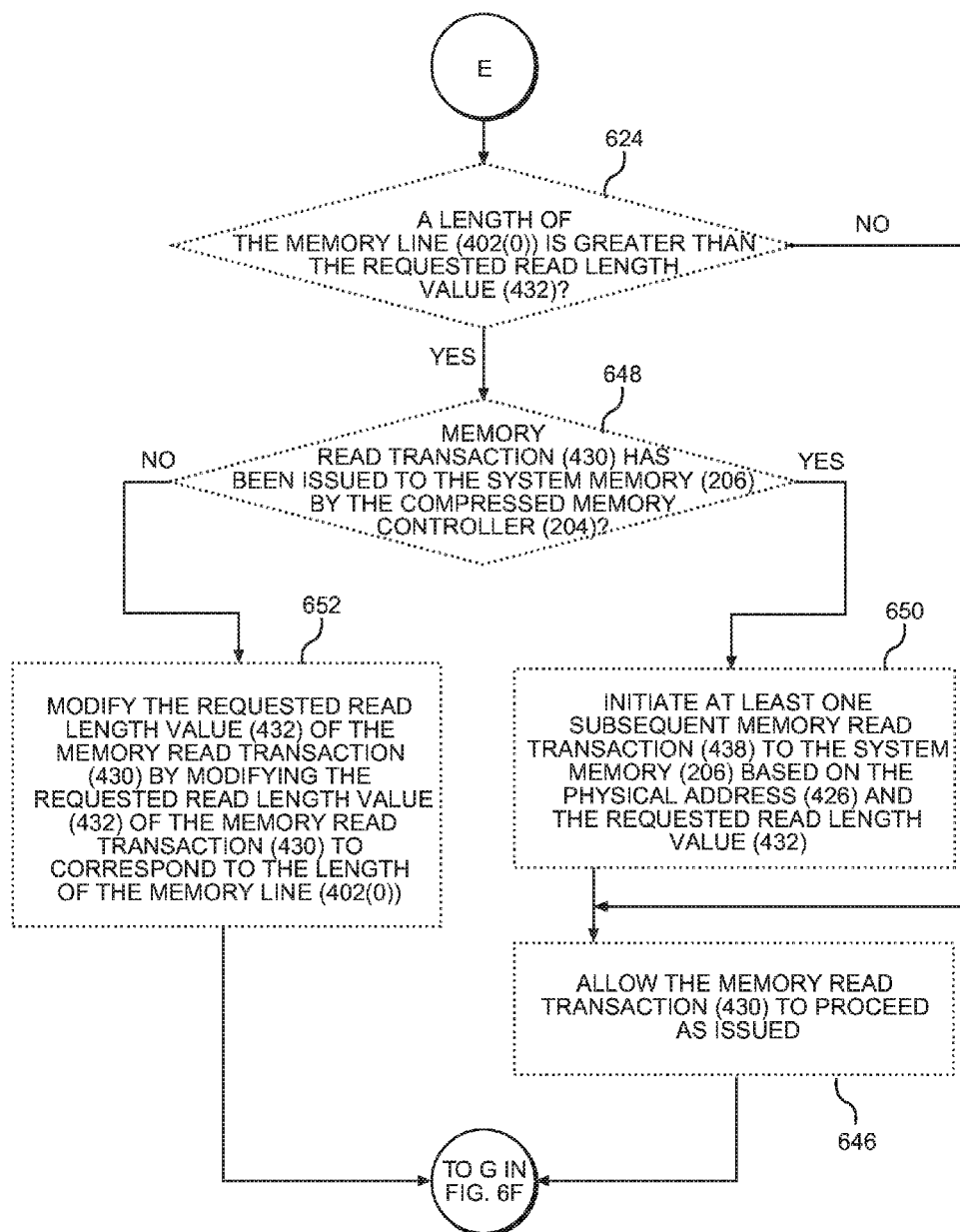
Figure 6F:
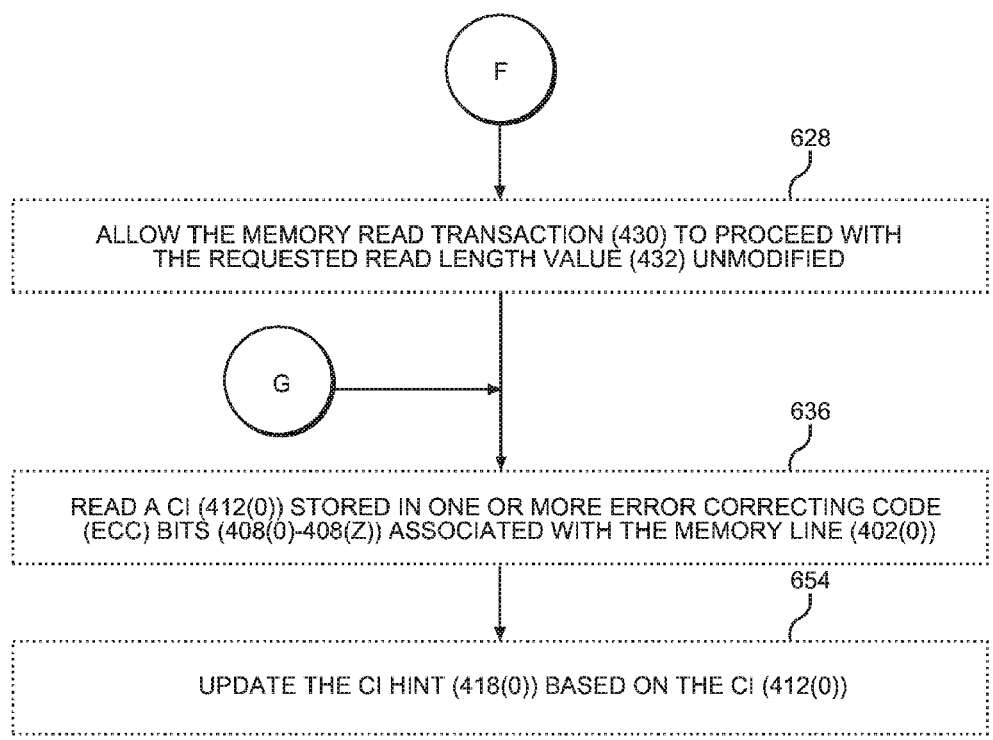
Figure 6G:
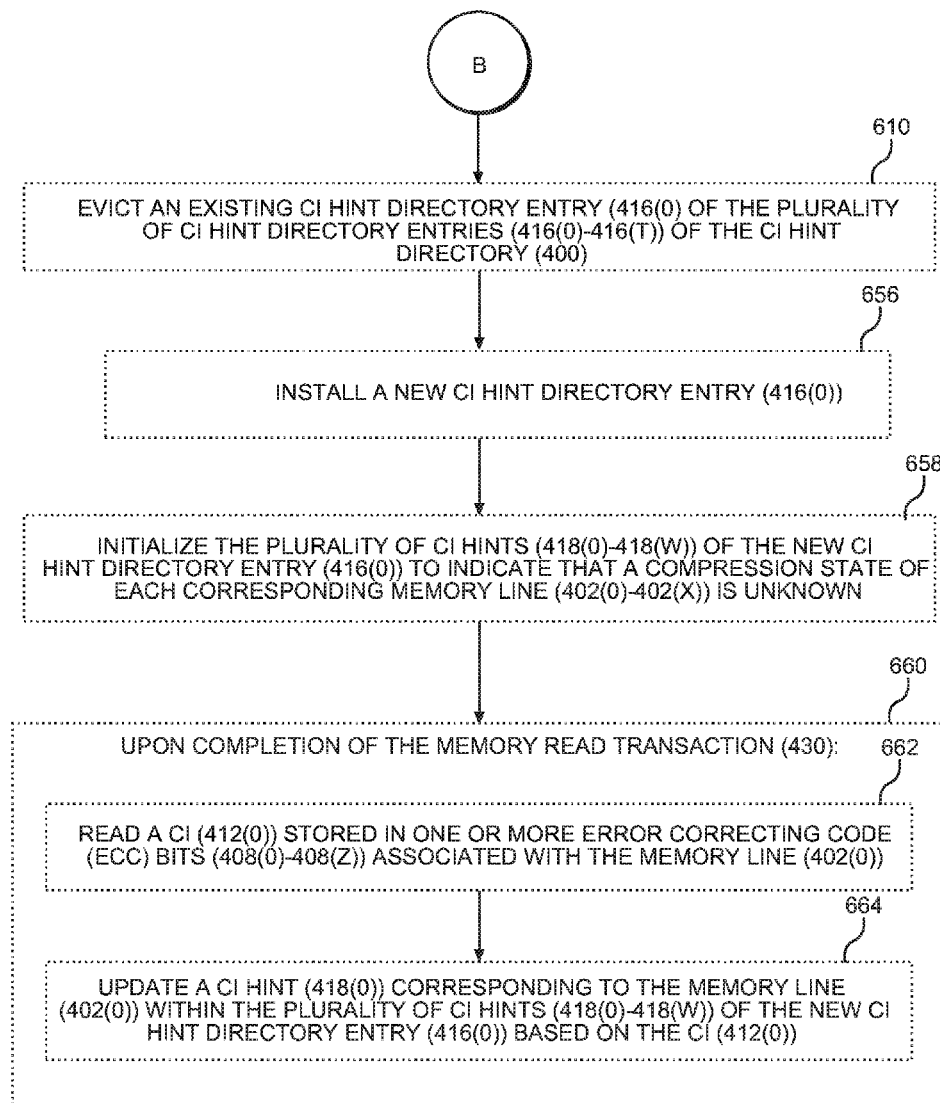

FIGS. 6A-6G are flowcharts illustrating further exemplary operations for performing a memory read operation by the compressed memory controller 204 of FIG. 2 using memory bandwidth compression. FIG. 6A illustrates exemplary operations for receiving the memory read request 424 and initiating the memory read transaction 430, while FIG. 6B illustrates exemplary operations for determining a compression state (if any) of the memory line 402(0) using the CI hint directory 400. FIGS. 6C, 6D, 6E, and 6F illustrate exemplary operations that may be carried out when the memory line 402(0) comprises a specified pattern, is known to be compressed, is known to be uncompressed, or has a compression state that is unknown, respectively. FIG. 6G illustrates exemplary operations that may be carried out by the compressed memory controller 204 in the case of a "miss" on the CI hint directory 400. For the sake of clarity, elements of FIGS. 2, 4A, and 4B may be referenced in describing FIGS. 6A-6G.

In FIG. 6A, operations according to some aspects of the compressed memory controller 204 begin with the compressed memory controller 204 using the compression monitor 442 to track a compression ratio 444 based on at least one of a number of reads of compressed data, a total number of read operations, a number of writes of compressed data, and a total number of write operations (block 600). The compressed memory controller 204 receives a memory read request 424 comprising a physical address 426 of a memory line 402(0) in a system memory 206 (block 602). In aspects of the compressed memory controller 204 employing the compression monitor 442, the compressed memory controller 204 may determine the requested read length value 432 based on the compression ratio 444 (block 604).

The compressed memory controller 204 then initiates a memory read transaction 430 comprising the requested read length value 432 to the system memory 206 based on the physical address 426 (block 606). In parallel with initiating the memory read transaction 430, the compressed memory controller 204 also determines whether the physical address 426 corresponds to a CI hint directory entry 416(0) of a plurality of CI hint directory entries 416(0)-416(T) of a CI hint directory 400 of the compressed memory controller 204 (block 608). If the physical address 426 does not correspond to any of the plurality of CI hint directory entries 416(0)-416(T) (i.e., a "miss" on the CI hint directory 400), processing resumes at block 610 in FIG. 6G. However, if the compressed memory controller 204 determines at decision block 608 that the physical address 426 does correspond to a CI hint directory entry 416(0) (i.e., a "hit"), processing resumes at block 612 of FIG. 6B.

Referring now to FIG. 6B, in the event of a hit on the CI hint directory 400, the compressed memory controller 204 next reads the CI hint 418(0) for the memory line 402(0) from the CI hint directory entry 416(0) (block 612). In some aspects, the compressed memory controller 204 then determines whether the CI hint 418(0) indicates that the memory line 402(0) comprises a specified pattern (block 614). If the memory line 402(0) is determined to comprise a specified pattern, processing resumes at block 616 of FIG. 6C. Otherwise, the compressed memory controller 204 according to some aspects may determine whether the CI hint 418(0) indicates that the memory line 402(0) is known to be compressed (block 618). If so, processing resumes at block 620 of FIG. 6D.

If the compressed memory controller 204 determines at decision block 618 that the CI hint 418(0) does not indicate that the memory line 402(0) is known to be compressed, some aspects of the compressed memory controller 204 may determine whether the CI hint 418(0) indicates that the memory line 402(0) is known to be uncompressed (block 622). If the memory line 402(0) is determined to be uncompressed, processing resumes at block 624 of FIG. 6E. Otherwise, according to some aspects, the compressed memory controller 204 may determine whether the CI hint 418(0) indicates that a compression state of the memory line 402(0) is unknown (block 626). If so, processing resumes at block 628 of FIG. 6F. If the compressed memory controller 204 determines at decision block 626 that the CI hint 418(0) does not indicate that the compression state of the memory line 402(0) is unknown, the compressed memory controller 204 may conclude that the CI hint 418(0) is invalid (block 630). Note that this circumstance may arise only in aspects of the compressed memory controller 204 in which the CI hint 418(0) may have values that are not previously associated with a compression state of the memory line 402(0).

Turning now to FIG. 6C, the compressed memory controller 204, in response to determining at decision block 614 of FIG. 6B that the memory line 402(0) comprises a specified pattern (such as all zeroes), returns the specified pattern (which may be all zeroes, in one aspect) in response to the memory read request 424 (block 616). The compressed memory controller 204 in some aspects may then determine whether the memory read transaction 430 has been issued to the system memory 206 (block 632). If not, the compressed memory controller 204 may cancel the memory read transaction 430 (block 634). Processing then resumes at block 636 of FIG. 6F. Otherwise, the memory read transaction 430 may be processed conventionally, and the compressed memory controller 204 may discard a subsequent response from the system memory 206 to the memory read transaction 430 (block 638). Processing then resumes at block 636 of FIG. 6F.

In FIG. 6D, after determining at decision block 618 of FIG. 6B that the memory line 402(0) is known to be compressed, the compressed memory controller 204 determines whether the compressed length of the memory line 402(0) is not equal to the requested read length value 432 (block 620). If the compressed length of the memory line 402(0) is equal to the requested read length value 432, the compressed memory controller 204 allows the memory read transaction 430 to proceed as issued (block 640). Processing then resumes at block 636 of FIG. 6F. However, if the compressed length of the memory line 402(0) is determined at decision block 620 to be not equal to the requested read length value 432, then an opportunity to reduce memory bandwidth by reducing the requested read length value 432 of the memory read transaction 430 is present.

Accordingly, the compressed memory controller 204 determines whether the memory read transaction 430 has been issued to the system memory 206 (block 642). If the memory read transaction 430 has already been issued, then it is too late to modify the requested read length value 432, and, thus, the compressed memory controller 204 allows the memory read transaction 430 to proceed as issued (block 640). Processing then resumes at block 636 of FIG. 6F. If the memory read transaction 430 has not yet been issued by the compressed memory controller 204, the requested read length value 432 of the memory read transaction 430 is modified by modifying the requested read length value 432 of the memory read transaction 430 to correspond to the compressed length of the memory line 402(0) (block 644). Processing then resumes at block 636 of FIG. 6F.

Referring now to FIG. 6E, upon determining at decision block 622 of FIG. 6B that the memory line 402(0) is known to be uncompressed, the compressed memory controller 204 determines whether a length of the memory line 402(0) is greater than the requested read length value 432 (block 624). If not, the compressed memory controller 204 allows the memory read transaction 430 to proceed as issued (block 646). Processing then resumes at block 636 of FIG. 6F. However, if the compressed memory controller 204 determines at decision block 624 that the length of the memory line 402(0) is not greater than the requested read length value 432, an opportunity to reduce memory bandwidth by increasing the requested read length value 432 of the memory read transaction 430 is present.

Thus, the compressed memory controller 204 determines whether the memory read transaction 430 has been issued to the system memory 206 (block 648). If the memory read transaction 430 has already been issued, then the requested read length value 432 cannot be modified. However, the compressed memory controller 204 may still reduce memory read latency by immediately issuing at least one subsequent memory read transaction 438 without waiting for the memory read transaction 430 to complete. Accordingly, the compressed memory controller 204 initiates at least one subsequent memory read transaction 438 to the system memory 206 based on the physical address 426 and the requested read length value 432 (block 650). The memory read transaction 430 then proceeds as issued (block 646). Processing then resumes at block 636 of FIG. 6F. If the compressed memory controller 204 determines at decision block 648 that the memory read transaction 430 has not yet been issued, the compressed memory controller 204 in some aspects may modify the requested read length value 432 of the memory read transaction 430 by modifying the requested read length value 432 of the memory read transaction 430 to correspond to the length of the memory line 402(0) (block 652). Processing then resumes at block 636 of FIG. 6F.

Turning now to FIG. 6F, if the compressed memory controller 204 determines at decision block 626 of FIG. 6B that the memory line 402(0) has an unknown compression state, the compressed memory controller 204 according to some aspects may allow the memory read transaction 430 to proceed with the requested read length value 432 unmodified (block 628). Upon completion of the memory read transaction 430, the compressed memory controller 204 may read a CI 412(0) stored in one or more ECC bits 408(0)-408(Z) associated with the memory line 402(0) (block 636). The compressed memory controller 204 may then update the CI hint 418(0) based on the CI 412(0) (block 654).

In FIG. 6G, after determining at decision block 608 of FIG. 6A that the physical address 426 does not correspond to any of the plurality of CI hint directory entries 416(0)-416(T) of the CI hint directory 400, the compressed memory controller 204 in some aspects may evict (i.e., discard without saving) an existing CI hint directory entry 416(0) of the plurality of CI hint directory entries 416(0)-416(T) of the CI hint directory 400 (block 610). The compressed memory controller 204 then installs a new CI hint directory entry 416(0) (block 656). The compressed memory controller 204 initializes the plurality of CI hints 418(0)-418(W) of the new CI hint directory entry 416(0) to indicate that a compression state of each corresponding memory line 402(0)-402(X) is unknown (block 658). Upon completion of the memory read transaction 430, the compressed memory controller 204 may carry out the operations shown in block 660 of FIG. 6G. The compressed memory controller 204 may read a CI 412(0) stored in one or more error correcting code (ECC) bits 408(0)-408(Z) associated with the memory line 402(0) (block 662). The compressed memory controller 204 may then update a CI hint 418(0) corresponding to the memory line 402(0) within the plurality of CI hints 418(0)-418(W) of the new CI hint directory entry 416(0) based on the CI 412(0) (block 664).

Figure 7A:
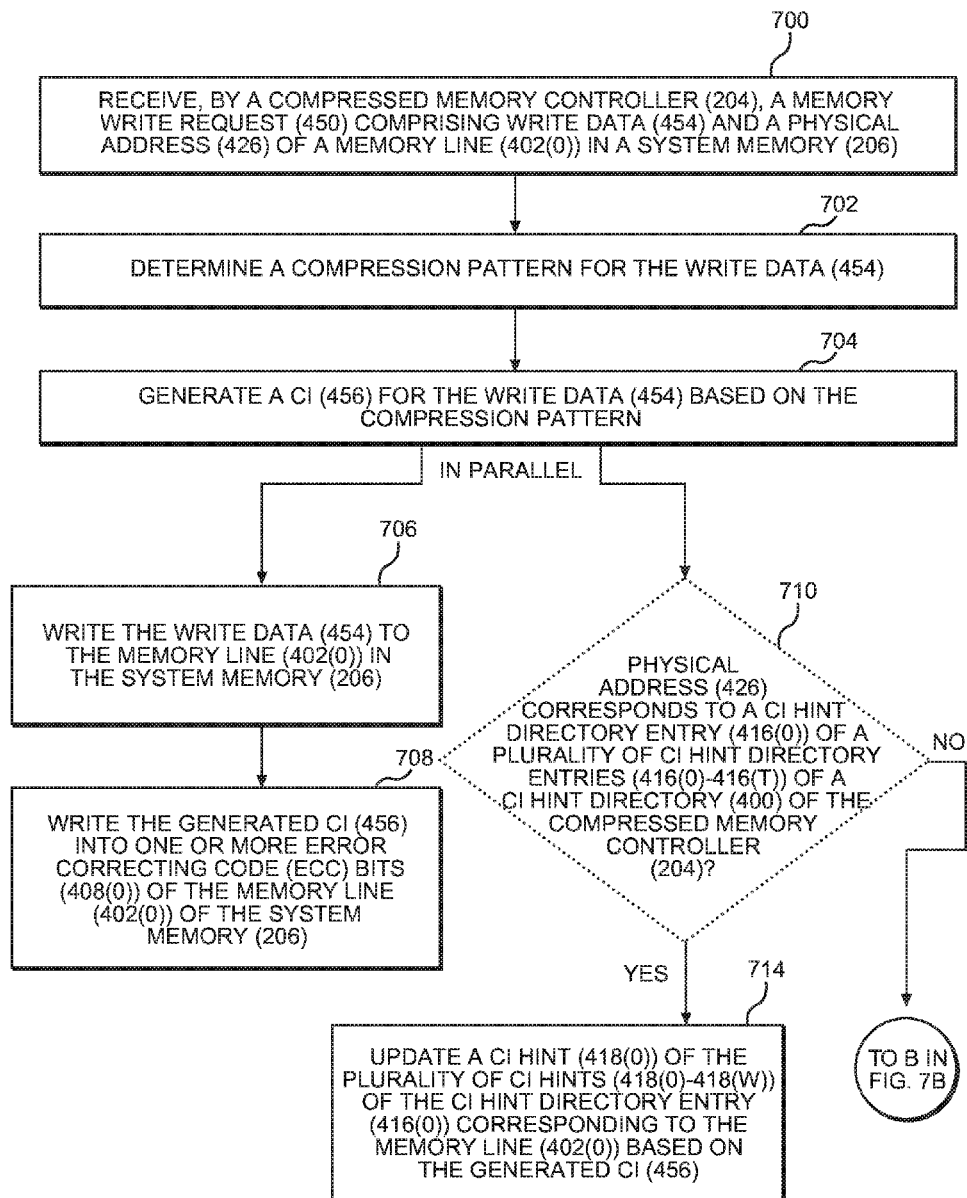
FIGS. 7A-7B are flowcharts illustrating exemplary operations for performing a memory write operation by the compressed memory controller in FIG. 2 using memory bandwidth compression.
Figure 7B:
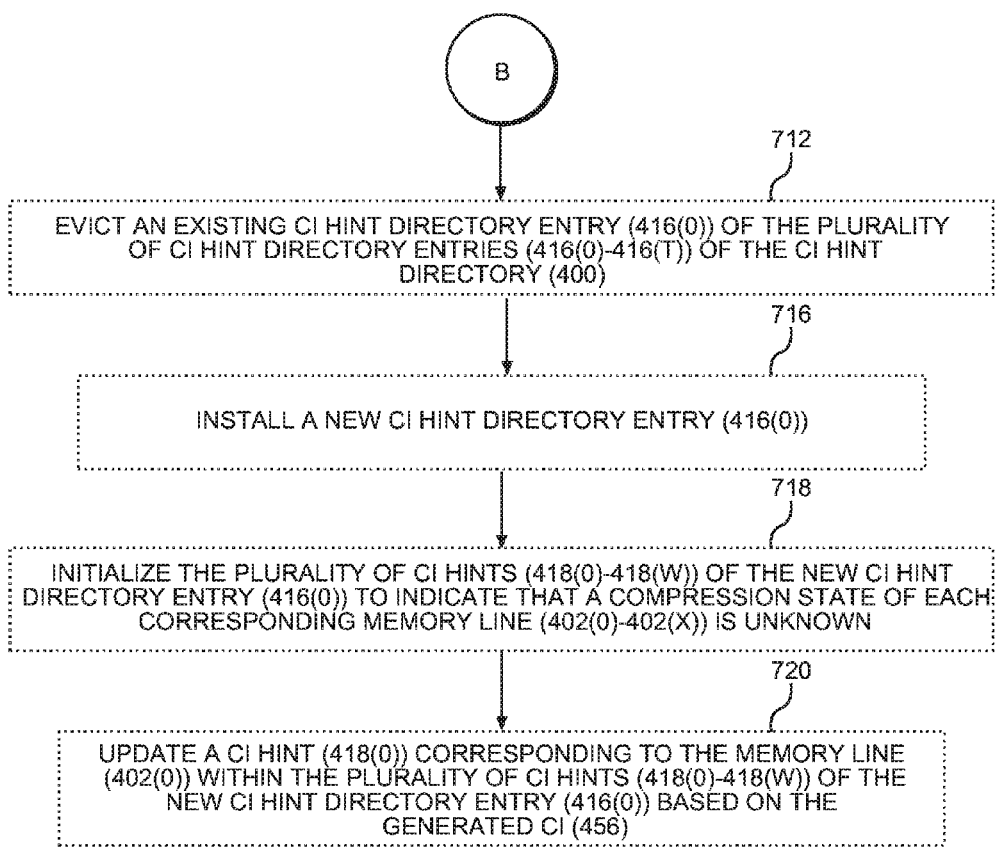

To illustrate exemplary operations for performing a memory write operation by some aspects of the compressed memory controller 204 of FIG. 2 using memory bandwidth compression, FIGS. 7A and 7B are provided. Elements of FIGS. 2, 4A, and 4B may be referenced in describing FIGS. 7A and 7B for the sake of clarity. In FIG. 7A, operations begin with the compressed memory controller 204 receiving a memory write request 450 comprising write data 454 and a physical address 426 of a memory line 402(0) in a system memory 206 (block 700). The compressed memory controller 204 thus may be referred to herein as "a means for receiving a memory write request comprising write data and a physical address of a memory line in a system memory." The compressed memory controller 204 determines a compression pattern for the write data 454 (block 702). In this regard, the compressed memory controller 204 may be referred to herein as "a means for determining a compression pattern for the write data." The compression pattern may indicate, as non-limiting examples, whether or not the write data 454 was successfully compressed, and/or a number of memory blocks 404(0)-404(Z), 406(0)-406(Z) to be occupied by the compressed write data 454. The compressed memory controller 204 then generates a CI 456 for the write data 454 based on the compression pattern (block 704). Accordingly, the compressed memory controller 204 may be referred to herein as "a means for generating a CI for the write data based on the compression pattern."

The compressed memory controller 204 next writes the write data 454 to the memory line 402(0) in the system memory 206 (block 706). In this regard, the compressed memory controller 204 may be referred to herein as "a means for writing the write data to the memory line in the system memory." The compressed memory controller 204 also writes the generated CI 456 into one or more ECC bits 408(0) of the memory line 402(0) of the system memory 206 (block 708). The compressed memory controller 204 thus may be referred to herein as "a means for writing the generated CI into one or more ECC bits of the memory line of the system memory." In parallel with writing the write data 454 to the memory line 402(0), the compressed memory controller 204 determines whether the physical address 426 corresponds to a CI hint directory entry 416(0) of a plurality of CI hint directory entries 416(0)-416(T) of a CI hint directory 400 of the compressed memory controller 204 (block 710). Accordingly, the compressed memory controller 204 may be referred to herein as "a means for determining whether the physical address corresponds to a CI hint directory entry of a plurality of CI hint directory entries of a CI hint directory of the compressed memory controller, in parallel with writing the write data to the memory line in the system memory." If the physical address 426 does not correspond to a CI hint directory entry 416(0) of the plurality of CI hint directory entries 416(0)-416(T) of the CI hint directory 400 of the compressed memory controller 204 (i.e., a "miss" on the CI hint directory 400), processing resumes at block 712 of FIG. 7B. However, if the compressed memory controller 204 determines at block 710 that the physical address 426 corresponds to the CI hint directory entry 416(0), the compressed memory controller 204 updates a CI hint 418(0) of the plurality of CI hints 418(0)-418(W) of the CI hint directory entry 416(0) corresponding to the memory line 402(0) based on the generated CI 456 (block 714). In this regard, the compressed memory controller 204 may be referred to herein as "a means for updating a CI hint of a plurality of CI hints of the CI hint directory entry corresponding to the memory line based on the generated CI."

Referring now to FIG. 7B, the compressed memory controller 204, upon detecting the miss on the CI hint directory 400, may evict an existing CI hint directory entry 416(0) of the plurality of CI hint directory entries 416(0)-416(T) of the CI hint directory 400 (block 712). The compressed memory controller 204 next installs a new CI hint directory entry 416(0) (block 716). In some aspects, the decision to evict the existing CI hint directory entry 416(0) and install the new CI hint directory entry 416(0) may be based on a probabilistic determination, such that the eviction and installation only occurs with a specified probability (e.g., 10%). The plurality of CI hints 418(0)-418(W) of the new CI hint directory entry 416(0) are initialized by the compressed memory controller 204 to indicate that a compression state of each corresponding memory line 402(0)-402(X) is unknown (block 718). The compressed memory controller 204 then updates a CI hint 418(0) corresponding to the memory line 402(0) within the plurality of CI hints 418(0)-418(W) of the new CI hint directory entry 416(0) based on the generated CI 456 (block 720).

Providing memory bandwidth compression using CI hint directories in a CPU-based system according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
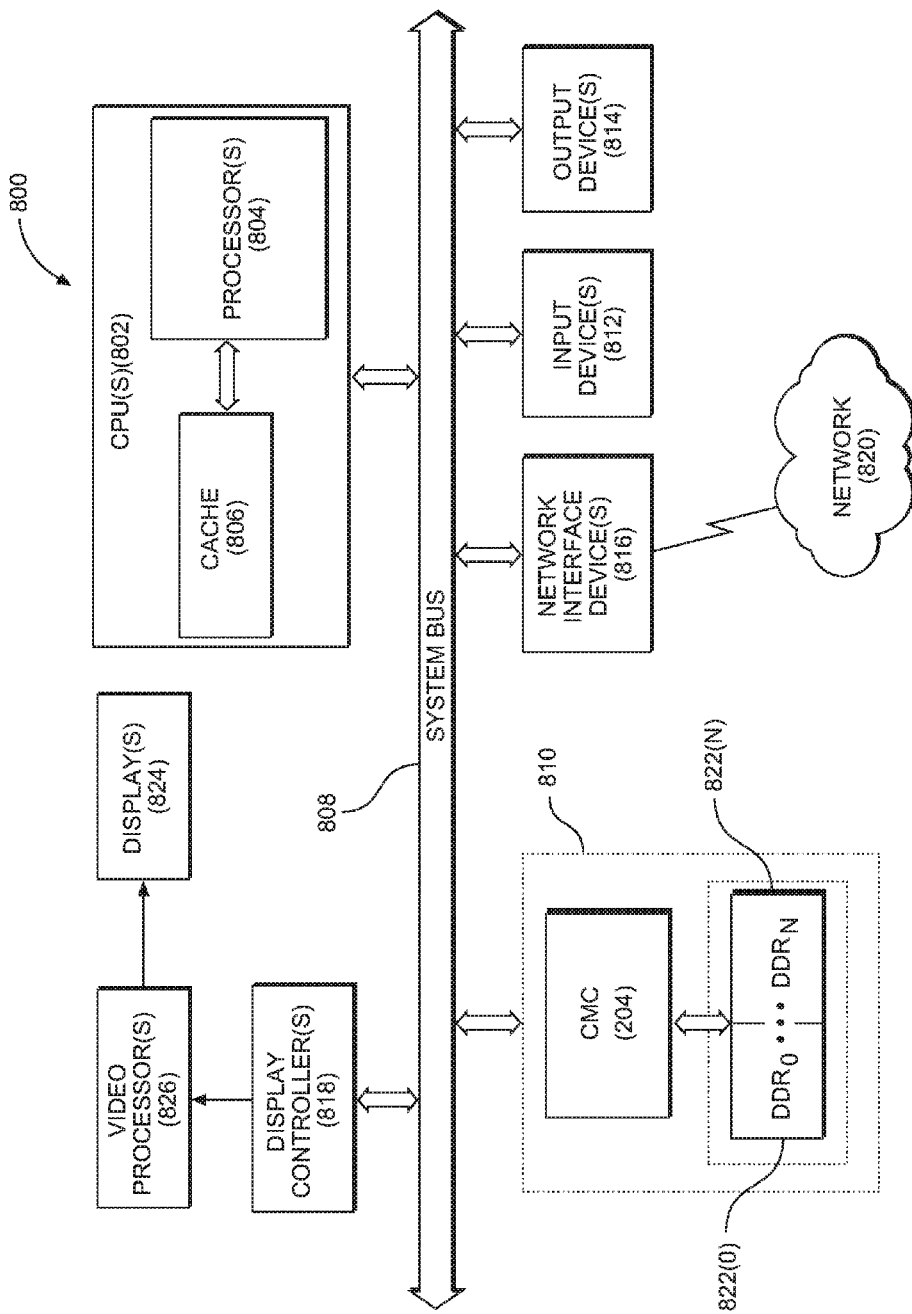
FIG. 8 is a block diagram of an exemplary computing device that may include the SoC in FIG. 1 that employs the compressed memory controller in FIG. 2.

In this regard, FIG. 8 illustrates an example of a processor-based system 800 that can employ the SoC 200 with the compressed memory controller (CMC) 204 of FIG. 2. In this example, the processor-based system 800 includes one or more CPUs 802, each including one or more processors 804. The CPU(s) 802 may have cache memory 806 coupled to the processor(s) 804 for rapid access to temporarily stored data. The CPU(s) 802 is coupled to a system bus 808 and can intercouple devices included in the processor-based system 800. As is well known, the CPU(s) 802 communicates with these other devices by exchanging address, control, and data information over the system bus 808. For example, the CPU(s) 802 can communicate bus transaction requests to the CMC 204 as an example of a slave device. Although not illustrated in FIG. 8, multiple system buses 808 could be provided.

Other devices can be connected to the system bus 808. As illustrated in FIG. 8, these devices can include a memory system 810, one or more input devices 812, one or more output devices 814, one or more network interface devices 816, and one or more display controllers 818, as examples. The input device(s) 812 can include any type of input device, including but not limited to input keys, switches, voice processors, etc. The output device(s) 814 can include any type of output device, including but not limited to audio, video, other visual indicators, etc. The network interface device(s) 816 can be any devices configured to allow exchange of data to and from a network 820. The network 820 can be any type of network, including but not limited to a wired or wireless network, a private or public network, a local area network (LAN), a wide local area network, wireless local area network, BLUETOOTH (BT), and the Internet. The network interface device(s) 816 can be configured to support any type of communications protocol desired. The memory system 810 can include one or more memory units 822(0)-822(N).

The CPU(s) 802 may also be configured to access the display controller(s) 818 over the system bus 808 to control information sent to one or more displays 824. The display controller(s) 818 sends information to the display(s) 824 to be displayed via one or more video processors 826, which process the information to be displayed into a format suitable for the display(s) 824. The display(s) 824 can include any type of display, including but not limited to a cathode ray tube (CRT), a liquid crystal display (LCD), a light emitting diode (LED) display, a plasma display, etc.

The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A compressed memory controller, comprising:
a memory interface configured to access a system memory via a system bus; and
a compression indicator (CI) hint directory comprising a plurality of CI hint directory entries, each comprising a plurality of CI hints;
the compressed memory controller configured to:
receive a memory read request comprising a physical address of a memory line in the system memory;
initiate a memory read transaction comprising a requested read length value to the system memory based on the physical address;
in parallel with initiating the memory read transaction, determine whether the physical address corresponds to a CI hint directory entry of the plurality of CI hint directory entries of the CI hint directory; and
responsive to determining that the physical address corresponds to a CI hint directory entry of the plurality of CI hint directory entries of the CI hint directory:
read a CI hint of the plurality of CI hints for the memory line from the CI hint directory entry; and
modify the requested read length value of the memory read transaction based on the CI hint for the memory line.

2. The compressed memory controller of claim 1, further configured to, prior to modifying the requested read length value of the memory read transaction based on the CI hint for the memory line:
determine whether the memory read transaction has been issued to the system memory by the compressed memory controller;
wherein the compressed memory controller is configured to modify the requested read length value of the memory read transaction based on the CI hint for the memory line responsive to determining that the memory read transaction has not been issued to the system memory by the compressed memory controller.

3. The compressed memory controller of claim 2, further configured to, prior to determining whether the memory read transaction has been issued to the system memory by the compressed memory controller:
determine whether the CI hint indicates that the memory line comprises a specified pattern; and
responsive to determining that the CI hint indicates that the memory line comprises a specified pattern:
return the specified pattern in response to the memory read request;
responsive to determining that the memory read transaction has not been issued to the system memory by the compressed memory controller, cancel the memory read transaction; and
responsive to determining that the memory read transaction has been issued to the system memory by the compressed memory controller, discard a subsequent response from the system memory to the memory read transaction.

4. The compressed memory controller of claim 2, further configured to, prior to determining whether the memory read transaction has been issued to the system memory by the compressed memory controller:
determine whether the CI hint indicates that the memory line is known to be compressed; and
responsive to determining that the CI hint indicates that the memory line is known to be compressed, determine whether a compressed length of the memory line is less than the requested read length value;
wherein the compressed memory controller is configured to modify the requested read length value of the memory read transaction based on the CI hint for the memory line further responsive to determining that the compressed length of the memory line is less than the requested read length value, by modifying the requested read length value of the memory read transaction to correspond to the compressed length of the memory line.

5. The compressed memory controller of claim 2, further configured to, prior to determining whether the memory read transaction has been issued to the system memory by the compressed memory controller:
determine whether the CI hint indicates that the memory line is known to be uncompressed; and
responsive to determining that the CI hint indicates that the memory line is known to be uncompressed, determine whether a length of the memory line is greater than the requested read length value;
wherein the compressed memory controller is configured to modify the requested read length value of the memory read transaction based on the CI hint for the memory line further responsive to determining that the length of the memory line is greater than the requested read length value, by modifying the requested read length value of the memory read transaction to correspond to the length of the memory line.

6. The compressed memory controller of claim 5, further configured to, responsive to determining that the length of the memory line is greater than the requested read length value and the memory read transaction has been issued to the system memory by the compressed memory controller, initiate at least one subsequent memory read transaction to the system memory based on the physical address and the requested read length value.

7. The compressed memory controller of claim 2, further configured to, prior to modifying the requested read length value of the memory read request based on the CI hint for the memory line:
determine whether the CI hint indicates that a compression state of the memory line is unknown; and
responsive to determining that the CI hint indicates that the compression state of the memory line is unknown, allow the memory read transaction to proceed with the requested read length value unmodified.

8. The compressed memory controller of claim 1, further configured to, upon completion of the memory read transaction:
read a CI stored in one or more error correcting code (ECC) bits associated with the memory line; and
update the CI hint based on the CI.

9. The compressed memory controller of claim 1, further configured to, responsive to determining that the physical address does not correspond to a CI hint directory entry of the plurality of CI hint directory entries of the CI hint directory:
- evict an existing CI hint directory entry of the plurality of CI hint directory entries of the CI hint directory;
- install a new CI hint directory entry of the plurality of CI hint directory entries;
- initialize the plurality of CI hints of the new CI hint directory entry to indicate that a compression state of each corresponding memory line is unknown; and
- upon completion of the memory read transaction:
  - read a CI stored in one or more error correcting code (ECC) bits associated with the memory line; and
  - update the CI hint corresponding to the memory line based on the CI.

10. The compressed memory controller of claim 9, further configured to evict the existing CI hint directory entry, install the new CI hint directory entry, and initialize the plurality of CI hints of the new CI hint directory entry based on a probabilistic determination made by the compressed memory controller.

11. The compressed memory controller of claim 1, wherein each CI hint of the plurality of CI hints comprises two (2) bits and indicates whether the memory line corresponding to the CI hint is known to have a length of zero (0), is known to be compressed, is known to be uncompressed, or has a compression state that is unknown.

12. The compressed memory controller of claim 1, wherein each CI hint of the plurality of CI hints comprises one (1) bit, and indicates one of whether the memory line corresponding to the CI hint is known to be compressed or known to be uncompressed, or has a compression state that is unknown.

13. The compressed memory controller of claim 1, further comprising a compression monitor configured to track a compression ratio based on at least one of a number of reads of compressed data, a total number of read operations, a number of writes of compressed data, and a total number of write operations;
- the compressed memory controller further configured to determine the requested read length value based on the compression ratio.

14. The compressed memory controller of claim 1 integrated into an integrated circuit (IC).

15. The compressed memory controller of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

16. A method for providing memory bandwidth compression, comprising:
- receiving, by a compressed memory controller, a memory read request comprising a physical address of a memory line in a system memory;
- initiating a memory read transaction comprising a requested read length value to the system memory based on the physical address;
- in parallel with initiating the memory read transaction, determining whether the physical address corresponds to a compression indicator (CI) hint directory entry of a plurality of CI hint directory entries of a CI hint directory of the compressed memory controller;
- responsive to determining that the physical address corresponds to a CI hint directory entry of the plurality of CI hint directory entries of the CI hint directory of the compressed memory controller:
  - reading a CI hint of the plurality of CI hints for the memory line from the CI hint directory entry; and
  - modifying the requested read length value of the memory read transaction based on the CI hint for the memory line.

17. The method of claim 16, further comprising, prior to modifying the requested read length value of the memory read transaction based on the CI hint for the memory line:
- determining whether the memory read transaction has been issued to the system memory by the compressed memory controller;
- wherein modifying the requested read length value of the memory read transaction based on the CI hint for the memory line is responsive to determining that the memory read transaction has not been issued to the system memory by the compressed memory controller.

18. The method of claim 17, further comprising, prior to modifying the requested read length value of the memory read request based on the CI hint for the memory line:
- determining whether the CI hint indicates that the memory line comprises a specified pattern; and
- responsive to determining that the CI hint indicates that the memory line comprises a specified pattern:
  - returning the specified pattern in response to the memory read request;
  - responsive to determining that the memory read transaction has not been issued to the system memory by the compressed memory controller, canceling the memory read transaction; and
  - responsive to determining that the memory read transaction has been issued to the system memory by the compressed memory controller, discarding a subsequent response from the system memory to the memory read transaction.

19. The method of claim 17, further comprising, prior to modifying the requested read length value of the memory read transaction based on the CI hint for the memory line:
- determining whether the CI hint indicates that the memory line is known to be compressed; and
- responsive to determining that the CI hint indicates that the memory line is known to be compressed, determining whether a compressed length of the memory line is less than the requested read length value;
- wherein:
  - modifying the requested read length value of the memory read transaction based on the CI hint for the memory line is further responsive to determining that the compressed length of the memory line is less than the requested read length value; and
  - modifying the requested read length value of the memory read transaction comprises modifying the requested read length value of the memory read transaction to correspond to the compressed length of the memory line.

20. The method of claim 17, further comprising, prior to modifying the requested read length value of the memory read transaction based on the CI hint for the memory line:

determining whether the CI hint indicates that the memory line is known to be uncompressed; and responsive to determining that the CI hint indicates that the memory line is known to be uncompressed, determining whether a length of the memory line is greater than the requested read length value;

wherein:
  modifying the requested read length value of the memory read transaction based on the CI hint for the memory line is further responsive to determining that the length of the memory line is greater than the requested read length value; and
  modifying the requested read length value of the memory read transaction comprises modifying the requested read length value of the memory read transaction to correspond to the length of the memory line.

21. The method of claim 20, further comprising, responsive to determining that the length of the memory line is greater than the requested read length value and the memory read transaction has been issued to the system memory by the compressed memory controller, initiating at least one subsequent memory read transaction to the system memory based on the physical address and the requested read length value.

22. The method of claim 17, further comprising, prior to modifying the requested read length value of the memory read transaction based on the CI hint for the memory line:
  determining whether the CI hint indicates that a compression state of the memory line is unknown; and
  responsive to determining that the CI hint indicates that the compression state of the memory line is unknown, allowing the memory read transaction to proceed with the requested read length value unmodified.

23. The method of claim 16, further comprising, upon completion of the memory read transaction:
  reading a CI stored in one or more error correcting code (ECC) bits associated with the memory line; and
  updating the CI hint based on the CI.

24. The method of claim 16, further comprising, responsive to determining that the physical address does not correspond to a CI hint directory entry of the plurality of CI hint directory entries of the CI hint directory:
  evicting an existing CI hint directory entry of the plurality of CI hint directory entries of the CI hint directory;
  installing a new CI hint directory entry of the plurality of CI hint directory entries;
  initializing the plurality of CI hints of the new CI hint directory entry to indicate that a compression state of each corresponding memory line is unknown; and
  upon completion of the memory read transaction:
    reading a CI stored in one or more error correcting code (ECC) bits associated with the memory line; and
    updating the CI hint corresponding to the memory line within the plurality of CI hints of the new CI hint directory entry based on the CI.

25. The method of claim 24, wherein evicting the existing CI hint directory entry, installing the new CI hint directory entry, and initializing the plurality of CI hints of the new CI hint directory entry are performed based on a probabilistic determination.

26. The method of claim 16, wherein each CI hint of the plurality of CI hints comprises two (2) bits and indicates whether the memory line corresponding to the CI hint is known to have a length of zero (0), is known to be compressed, is known to be uncompressed, or has a compression state that is unknown.

27. The method of claim 16, wherein each CI hint of the plurality of CI hints comprises one (1) bit, and indicates one of whether the memory line corresponding to the CI hint is known to be compressed or known to be uncompressed, or has a compression state that is unknown.

28. The method of claim 16, further comprising:
  tracking, by a compression monitor of the compressed memory controller, a compression ratio based on at least one of a number of reads of compressed data, a total number of read operations, a number of writes of compressed data, and a total number of write operations; and
  determining the requested read length value based on the compression ratio.

29. A compressed memory controller, comprising:
  a means for receiving a memory read request comprising a physical address of a memory line in a system memory;
  a means for initiating a memory read transaction comprising a requested read length value to the system memory based on the physical address;
  a means for determining whether the physical address corresponds to a compression indicator (CI) hint directory entry of a plurality of CI hint directory entries of a CI hint directory of the compressed memory controller, in parallel with initiating the memory read transaction;
  a means for reading a CI hint of a plurality of CI hints for the memory line from the CI hint directory entry, responsive to determining that the physical address corresponds to a CI hint directory entry of the plurality of CI hint directory entries of the CI hint directory of the compressed memory controller; and
  a means for modifying the requested read length value of the memory read transaction based on the CI hint for the memory line, responsive to determining that the physical address corresponds to a CI hint directory entry of the plurality of CI hint directory entries of the CI hint directory of the compressed memory controller.

* * * * *